United States Patent [19]

Kato et al.

[11] 4,375,672
[45] Mar. 1, 1983

[54] ENGINE ANALYZER

[75] Inventors: Takayuki Kato, Nishikamo; Toshio Tsuji, Gifu; Kiyokazu Konishi, Anjo, all of Japan

[73] Assignee: K.K. Toyota Chuo Kenkyusho, et al., Aichi, Japan

[21] Appl. No.: 146,481

[22] Filed: May 5, 1980

[30] Foreign Application Priority Data

May 7, 1979 [JP] Japan .................................. 54-55955

[51] Int. Cl.³ .......................................... G01M 15/00
[52] U.S. Cl. .................................. 364/551; 73/117.2; 364/424
[58] Field of Search ............... 364/424, 550, 551, 431; 73/116, 117.2, 117.3; 324/278, 379, 384, 393

[56] References Cited

U.S. PATENT DOCUMENTS

| | | | |
|---|---|---|---|
| 4,064,747 | 12/1977 | Rackliffe et al. | 364/551 |
| 4,145,746 | 3/1979 | Trussell et al. | 364/424 |
| 4,179,922 | 12/1979 | Bouverie et al. | 364/551 |
| 4,215,404 | 7/1980 | Bukhtiyarov et al. | 364/431 |
| 4,234,921 | 11/1980 | Kinoshita et al. | 364/551 |
| 4,242,728 | 12/1980 | Hartford | 364/431 |
| 4,258,421 | 3/1981 | Juhasz et al. | 364/424 |
| 4,271,402 | 6/1981 | Kastura et al. | 364/431 |

Primary Examiner—Errol A. Krass
Attorney, Agent, or Firm—Koda and Androlia

[57] ABSTRACT

During analysis, sensors are connected to portions of an engine and thereabout and a starter driven by an auxiliary battery incorporated in a system. An engine of a motor car and electrical systems thereabout are automatically diagnosed by use of a computer to discriminate the good or bad condition thereof, whereby the results of diagnosis are outputted as a print out and a fault point or points is indicated by an indicating device. The indicating device successively shows in graphic display the contents of working performed by a worker in the predetermined order of working. Additionally, an engine drive control section automatically sets the analyzer in one of modes including an engine stopped mode, a cranking driven mode, an idling operation mode and the like in accordance with point or points of diagnosis of the vehicle being diagnosed.

29 Claims, 13 Drawing Figures

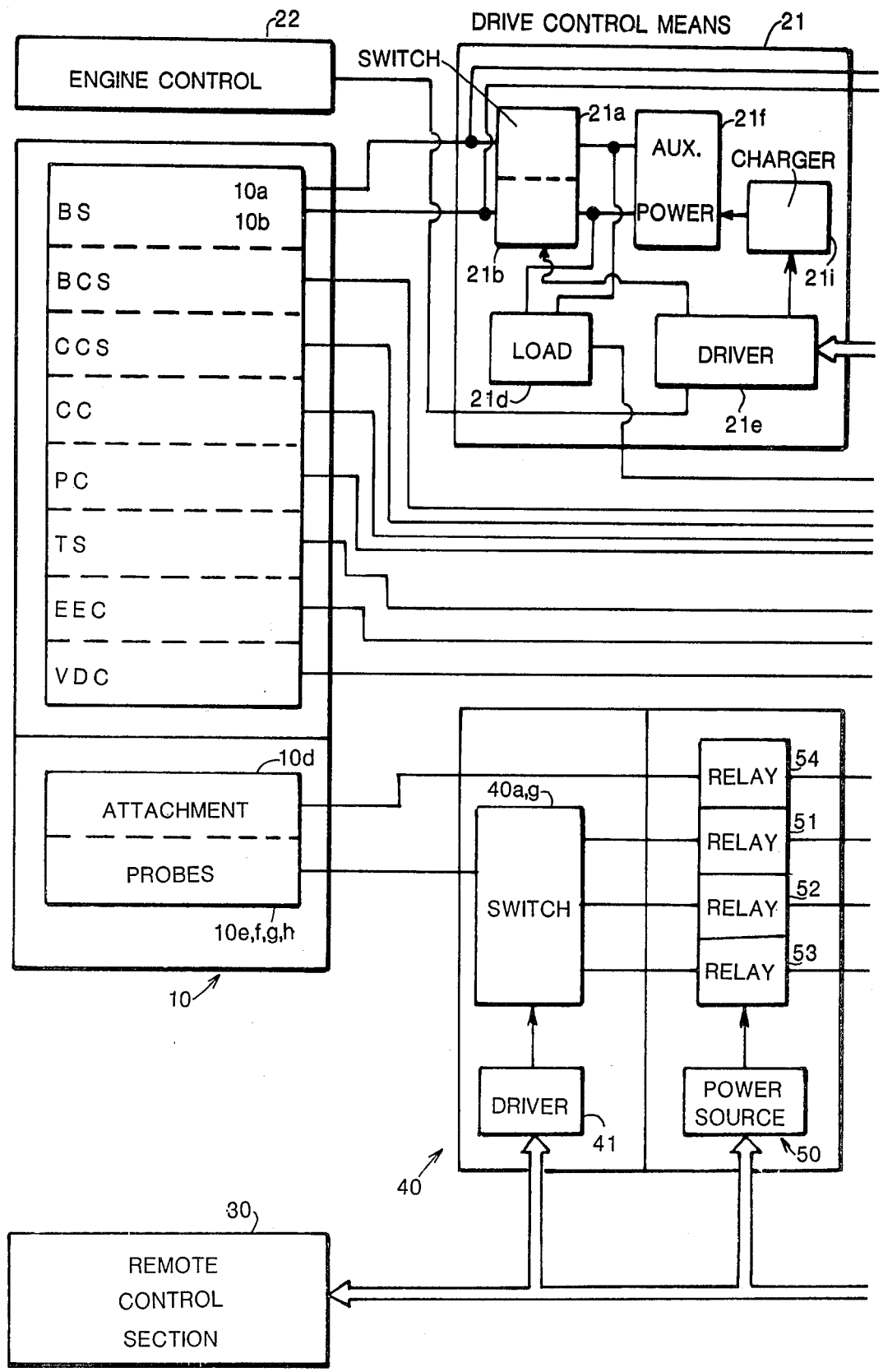
FIG. 11 (CONTINUE)

ENGINE ANALYZER

BACKGROUND OF THE INVENTION

1. Field of the Invention

The present invention relates to engine analyzers, and more particularly to an engine analyzer suitable for use in determining the good or bad condition of an internal combustion engine mounted in a motor car, which includes a computer used, and which ambient electric systems including that in the engine of the motor car are automatically diagnosed, a determination of a good or bad condition as a result of the diagnosis is automatically carried out, and the results of diagnosis and the fault point or points of the aforesaid electric systems are indicated.

2. Description of the Prior Art

The characteristics of engines of motor cars and the like are determined in the course of the manufacturing process of the vehicle or during the maintenance and inspections performed on the vehicle, and proper actions are taken based on the results. In recent years, the electric systems around the engine has developed into complicated and diversified system due to the complication in functions of the motor car; and, when some of the functions are converted into electronic ones, precise measuring techniques are required from the diagnosis or measurement in the ambient electric systems including that in the engine.

Further, the characteristics of the engine and electric systems therearound are based on not a single factor but the combination of many factors complicated and correlative with one another, and hence, precise analyzing techniques and appropriate determining techniques based on the results thereof are required.

Nevertheless, heretofore, the diagnosis or measurement of the engine and the electric systems therearound have been carried out in the following manner. Namely, a skilled engineer manually evaluates the operating conditions of engine and the sounds generated by the engine, and finds a fault point or points around the engine from the abnormalities such as the vibration and sounds generated by the engine, or several measuring instruments each having a single function provided side by side, wired and connected to measuring points corresponding thereto, while an operator operates the respective measuring instruments for each measured parameters, reads the indicated values of the respective measuring instrument, and determines the measured results based on reference values which have been previously provided to the operator or remembered by the operator.

According to the conventional method as described above, it has been impossible to in detail determine the causes of abnormalities in the engine, in which the respective factors of the engine and electric systems effect, by the manual evaluation performed by the skilled operator, and particularly, it has been completely impossible to point out a fault point or points in the electric systems.

Furthermore, the provision and use of a plurality of single-function measuring instruments leads to complex wiring connections and operation of the measuring instruments, thereby considerably reducing the operation efficiency. The operator reads the values indicated by these measuring instruments and determines the measured results, whereby errors in measurement amount due to personal inability, personal error and the like, and mistakes in determining the measured results tend to frequently occur, thus making it very difficult to measure and determine correctly.

In recent years, there have been published as the means of solving these problems several measuring systems referred to as "engine analyzers" or "automatic diagnoser" for diagnosing the characteristics around the engine through the utilization of a computer. In these measuring systems, there is adopted high technology electronic techniques and computer techniques and each of the measuring systems is principally connected to predetermined points for measuring of the motor car, which includes: a plurality of detectors for detecting the characteristics of the respective measuring points as electric signals; a signal processing circuit for converting electric signals obtained from the respective detectors into signal values to be easily processed by a computer or the like; a centralized process control circuit utilizing a computer or the like provided with memory means capable of presetting reference values for determining the respective diagnosing items, successively operating and processing the outputs fed from the signal processing circuit according to a preset program, comparing the measured results for the diagnosing items with the memory values and automatically determining the results; an indicator for indicating the measured values fed from the signal processing circuit and the centralized process control circuit; and a printer for recording the measured values, determined results and the like. With these highly developed measuring systems, a plurality of complicated measuring points can be measured and diagnosed in a very short period of time, further errors in measurement made by the operator can be eliminated, the determination made by the operator's bodily senses and perception in the prior art can be completely eliminated, and uniform diagnosis can be performed without resorting to the ability of the operator. Furthermore, through the utilization of a computer, the analyzing process of complicated signals can be centrally processed very easily and with high accuracy. Thus, these highly developed measuring systems, as compared with the conventional single function measuring system, has such characteristic features as improved measuring accuracies, decreased measuring time and easier expansion of ranges of higher measurement and diagnosis. Nevertheless, heretofore, even those highly developed measuring systems have had some problems. More specifically, the conventional engine analyzer or automatic diagnoser of the type as described is not provided with a means for driving from outside the engine and electric systems associated therewith which constitute the objects of diagnosis by themselves, whereby, in order to diagnose a capacitor, an interrupter should be manually opened and suitable measuring means should be used to measure, thereby making it impossible to automatically diagnose the capacitor even with a measuring means utilizing a computer.

Furthermore, the measuring system itself cannot crank or start the engine, and hence, the operator must operate an engine key switch, thus reducing the workability. Further, the measuring system is not provided with an auxiliary electric power source means for aiding a vehicle-mounted battery of the motor car to be diagnosed, and consequently, when the vehicle-mounted battery is low in performance, sometimes it becomes very difficult to crank or start the engine. Since the conventional engine analyzer or automatic diagnoser is of the type wherein the characteristics fed from the engine are converted into electric signals to be processed, it is necessary to remove and diagnose with suitable means the elements having no signal generating function by themselves, such as a high tension cords or ignition plugs in an ignition circuit, thus making it difficult to automatically diagnose. Further, the diagnosed results in the conventional apparatus are indicated to the operator or user of the motor car to be diagnosed through the printer's record or determined result indicating lamps for the respective diagnosing items, and therefore, it takes time to read the details of the printer's record or to visually assertain diagnosis indicating lamps, and particularly, it is difficult to instruct and make understood the diagnosed results to the general users having limited knowledge about the engines. As has been described above, even if computer techniques are introduced into the engine analyzer or automatic diagnoser, heretofore, the characteristics of the engine and electric systems therearound constituting the objects to be diagnosed have not been grasped sufficiently due to the lacking functions, thus resulting in an unsatisfactory diagnoser.

SUMMARY OF THE INVENTION

The present invention has been developed to obviate the disadvantages of the prior art, and a first object of the invention is to provide an engine analyzer, wherein the problems and disadvantages of the engine analyzer and automatic diagnosis apparatus using the conventional computer are obviated, and in the maintenance and inspection of the engine mounted in the motor car and the like, the characteristics of the engine and electric systems to be diagnosed can be grasped very easily and with high accuracy with simplified operation.

A second object of the present invention is to provide an engine analyzer suitable for the inspection of a multi-cylinder engine.

A third object of the present invention is to provide an engine analyzer, which an operator can very easily operate.

A fourth object of the present invention is to provide an engine analyzer for very easily instructing and making understood a fault point or points by the general users of the vehicle who have limited knowledge about the engine.

The present invention accomplishes the aforesaid first object by an engine analyzer including:

detecting means including a plurality of sensors connected to given portions around an engine, such as an internal combustion engine, for detecting the characteristics of the respective given portions as electric signals;

engine drive control means consisting of a control circuit capable of externally controlling a drive circuit of an engine starting motor and an external auxiliary electric power source connected as the power source for the starting motor;

signal processing means for converting electric signals fed from said detecting means and the engine drive control means to indicate the characteristics of the respective portions of the engine into signal values to be easily processed;

centralized control means including a computer for succesively operating and processing the outputs fed from the signal processing means according to a preset program, comparing and determining the results with the respective signals and feeding command signals for the inspection and diagnoses of the engine; and diagnosis indicating means being operable by the command signals of the outputs fed from the centralized control means for indicating the results of diagnoses of predetermined items of inspection.

The present invention further accomplishes the aforesaid second object, by an engine analyzer further including:

a plurality of diagnosing probe means for feeding inspection signals to a high voltage circuit section in an engine ignition circuit constituting part of the given portions; and multi-cylinder engine inspecting means consisting of a plurality of electric power sources for generating inspection signals in accordance with the purposes of inspection of the high voltage circuit section of the engine ignition circuit in the high voltage circuit section and a switching circuit for separately supplying the inspection signals selected in accordance with the respective cylinders to the plurality of diagnosing probe means.

The present invention further accomplishes the aforesaid third object, by an engine analyzer further including:

remote control means consisting of a timing light being operable by outputs fed from said centralized control means and from said signal processing means for flashing in synchronism with an ignition signal detected by the engine ignition circuit, a switch for regulating the flashing timing of the timing light through outputs fed from the centralized control means, and a switch for remotely controlling the engine analyzer itself.

The present invention further accomplishes the aforesaid fourth object, by an engine analyzer further including:

fault point indicating means being operable by the outputs fed from the centralized control means for showing the items of inspection on the given portions of the engine as a graphic display in a planar pattern, in which figures mainly indicating the points of inspection are illustrated by a combinations of letters and signs, so as to indicate the progress and results of inspection on the points of inspection.

BRIEF DESCRIPTION OF THE DRAWINGS

The abovementioned features and objects of the present invention will become more apparent by reference to the following description taken in conjunction with the accompanying drawings, wherein like referenced numerals denote like elements, and in which.

DESCRIPTION OF THE PREFERRED EMBODIMENT

Figure 1:
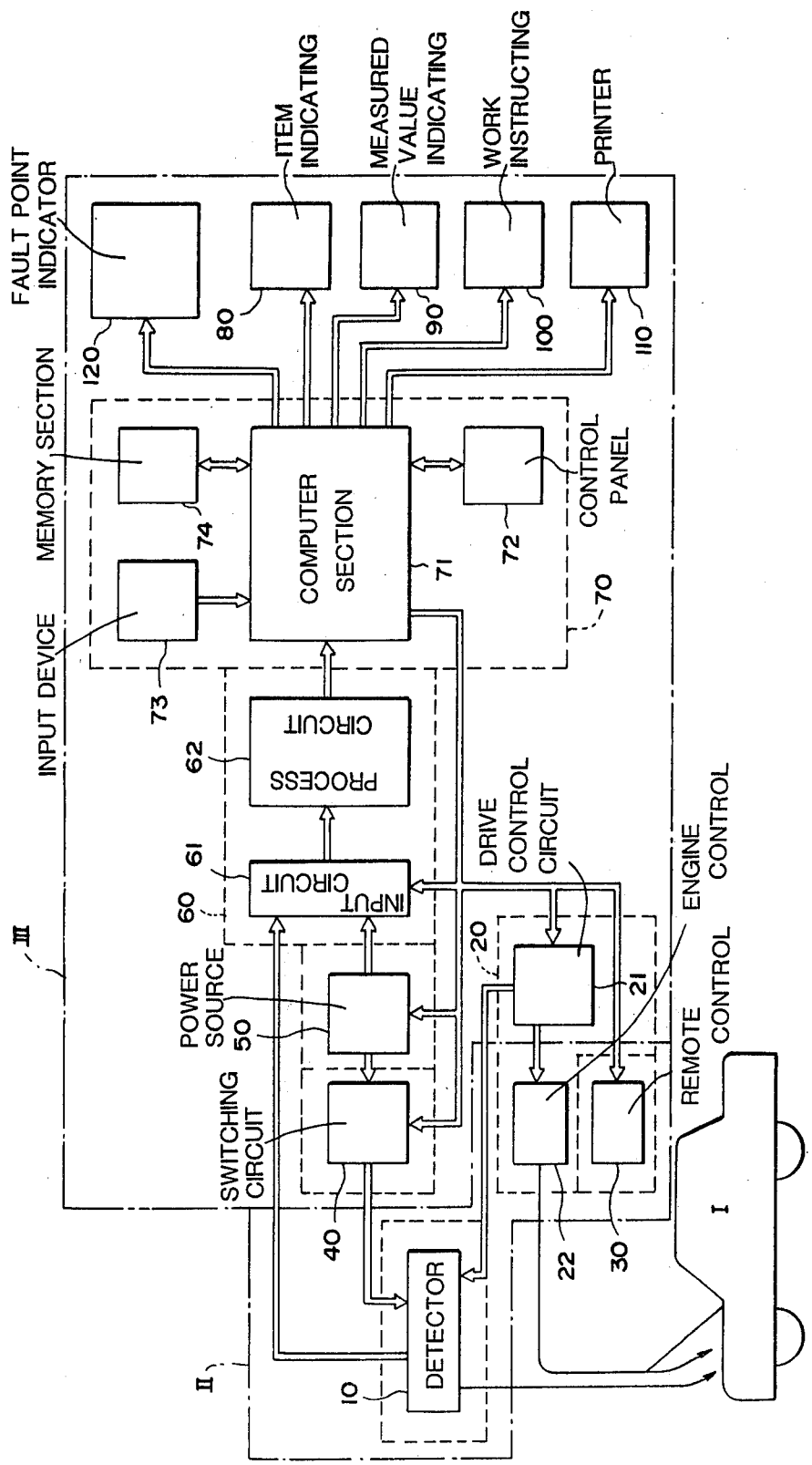
FIG. 1 is a block diagram showing the general arrangement of an embodiment of the engine analyzer according to the present invention.

Detailed description will hereunder be given of an embodiment of the present invention with reference to the drawings. As shown in FIG. 1, this embodiment includes a movable operation section II, which can be disposed adjacent to a vehicle I to be diagnosed and the main body III of engine analyzer.

The movable operation section II includes: a group of detectors 10 including a plurality of sensors connected to given diagnosing points of the vehicle to be diagnosed for receiving electric signals to grasp the characteristics of the diagnosing points and diagnosing probes for feeding inspection signals from the main body III of engine analyzer; an engine control terminal 22 for cranking or starting the engine of the vehicle I to be diagnosed in accordance with the diagnosing items; and a remote control section 30 having a timing light function, with which the operator operating the engine analyzer can remotely control the main body III of engine analyzer in the vicinity of the vehicle I to be diagnosed.

The main body III of engine analyzer comprises: an engine drive control section 20 consisting of a drive control circuit 21 including the aforesaid engine control terminal 22; a switching circuit section 40 for selecting a given cylinder or cylinders for the diagnosis of the vehicle I to be diagnosed and also selecting given diagnosing items; an inspection power source device 50 for feeding inspection signals to the vehicle I to be diagnosed through the switching circuit section 40 and the group of detectors 10; a signal process circuit secion 60 including an input circuit 61 and a process circuit 62 for converting electric signals fed from the group of detectors 10 and the inspection power source device 50 corresponding to the characteristics of the given diagnosing points of the vehicle I to be diagnosed into signal aspects to be easily processed by a computer; a centralized control section 70 for operating and controlling output signals fed from the signal process circuit section 60, and consisting of a computer section 71 for controlling through computer's commands the remote control section 30, engine drive control section 20, switching circuit section 40, inspection power source device 50, input circuit 61 and the like, a control panel 72, an input device 73, memory section 74 and the like; an item indicating section 80 controlled by the centralized control section 70 for successively indicating the preset diagnosing items in accordance with the preset program and for simultaneously indicating the diagnosed and determined results for the respective diagnosing items; a measured value indicating section 90 for indicating measured values for the respective diagnosing items; a work instruction section 100 for instructing the details of working to be carried out by the operator operating the engine analyzer itself; a printer 110 for recording the diagnosed results such as the diagnosing items, measured values and determined results; and a fault point indicator 120 for indicating a fault or defective point or points in the vehicle I to be diagnosed by a pattern patternizing the engine and electric on the determined results for the diagnosing items.

In the case the vehicle I to be diagnosed is inspected and diagnosed by an engine analyzer with the above described arrangement and functions, the aforesaid group of detectors 10 and engine control terminal 22 are manually connected by the operator to the given points of the vehicle I to be diagnosed, some of the specification of the vehicle I to be diagnosed are stored through the computer section 71 by the memory section 74 by use of the input device 73 and control panel 72 provided in the centralized control section 70 within the main body III of engine analyzer for the initial setting. The input device 73 has such a function that the data (such as the discriminating reference values for the respective diagnosing items) which were previously stored in a magnetic tape, magnetic card or paper card, to which the optical transmission or reflection is applied, are read by a reader and transferred to the memory section 74 through the computer section 71 and the specific setting items of the vehicle I to be diagnosed (such as the vehicle number, running distance, ignition system and the reference values of the diagnosing items, which are variable depending upon the vehicle) are stored by the memory section 74 through the computer section 71. If several diagnosing conditions corresponding to the details of diagnosis to the vehicle I to be diagnosed are initially set at the centralized control section 70 by the operator as described above, then a preset program corresponding to the vehicle I to be diagnosed is selected and determined. The preset program may be one in which the preset program is set by ROM, PROM, diode memory and the like in the memory section 74, another one in which the preset program is variable depending upon the vehicle I to be diagnosed and set by a RAM and the like.

Upon completing the initial setting, the operator carries out the diagnosis in accordance with the details indicated by the work instructing section 100 of the main body III of engine analyzer. The diagnosis is carried out by the operator in accordance with the details of the work instructing section 100, in which the details of working are indicated by commands of the centralized control section 70 by use of switches or the like each provided in the control panel 72 and the remote control section 30 capable of remotely controlling, and the confirmed details are returned to the centralized control section 70.

When the command from the centralized control section 70 coincides with the response of the operator and the preparation for the diagnosis is completed, the operator initiates the diagnosis. In case the command from the centralized control section 70 does not coincide with the response of the operator, i.e., a mistaken connection in the group of detectors 10 or an error in the initial setting exists, the centralized control section 70 has a self-determining function that indicates an abnormality and prevents the operator from initiating the diagnosis.

When the diagnosis is initiated by the operator, the given diagnosing points selected in the vehicle I to be diagnosed are successively diagnosed in accordance with a predetermined program preset in the centralized control section 70.

The diagnosis is carried out under various set conditions where the characteristics of the given diagnosing points are converted into electric signals with the highest fidelity, including the engine stopped condition, engine cranking condition, engine idling condition or engine quick accelerated condition, for each of which are selected diagnosing items to be commanded by the centralized control section 70.

These various set conditions of the vehicle I to be diagnosed are automatically set by successively and automatically operating and actuating the engine drive control section 20, switching circuit section 40, inspection power source device 50, input circuit 61 and the like in response to the command signals fed from the centralized control section 70.

During the diagnosis, the operator may operate the remote control section 30, in accordance with a command from the centralized control section 70, to bring about the set conditions of the vehicle I to be diagnosed, or may cancel or interrupt the diagnosis in his own judgement.

The progress of diagnosis on the preset points of the vehicle I to be diagnosed can be confirmed through the item indicating section 80 for indicating the diagnosing items and the measured results, and further, the measured values for the respective items can be successively known through a measurement indicating section 90. The determined results for the respective items indicated by the item indicating section 80 and the measured values for the respective items indicated by the measurement indicating section 90 are successively stored by the memory section 74 in the centralized control section 70.

When the abovedescribed actions are completed and the end of the diagnosis is indicated by the work instructing section 100 in the centralized control section 70, the details of the diagnosis, which have been stored by the memory section 74 are printed on recording paper, and at the same time, a single fault point or a combination of two or more fault points are determined based on the determined results for the respective diagnosing items, and the previously selected fault point or points are indicated by a fault point indicator 120 as a clear picture patternizing the engine and electric systems therearound of the vehicle I to be diagnosed. Consequently, the operator or the users of the vehicle I to be diagnosed can instantly ascertain the fault point or points without waiting for the completion of the diagnosis record paper prepared by the printer 110.

As described hereinabove, the engine analyzer according to the present invention has several special and very effective functions as a diagnosis apparatus for the vehicle, which are not provided on the conventional engine analyzer or automatic diagnoser using a computer, the abovedescribed functions being performed by:

a special inspection function including diagnosing probes provided in the group of detectors 10 and capable of feeding inspection signals from the main body III of engine analyzer to the given points of the vehicle I to be diagnosed, the switching circuit section 40 and the inspection power source device 50;

the engine drive control section 20 including the engine drive terminal 22 and the drive control circuit 21 and having a function of automatically setting the vehicle I to be diagnosed into the engine stopped condition, cranking condition or idling condition depending upon the given diagnosing points; and the fault point indicator 120 for indicating a fault point or points of the vehicle I to be diagnosed as a clear pattern of the engine and electric systems therearound based on the diagnosed results, so that the fault point or points can be easily understood by the operator and the user of the vehicle.

Figure 2:
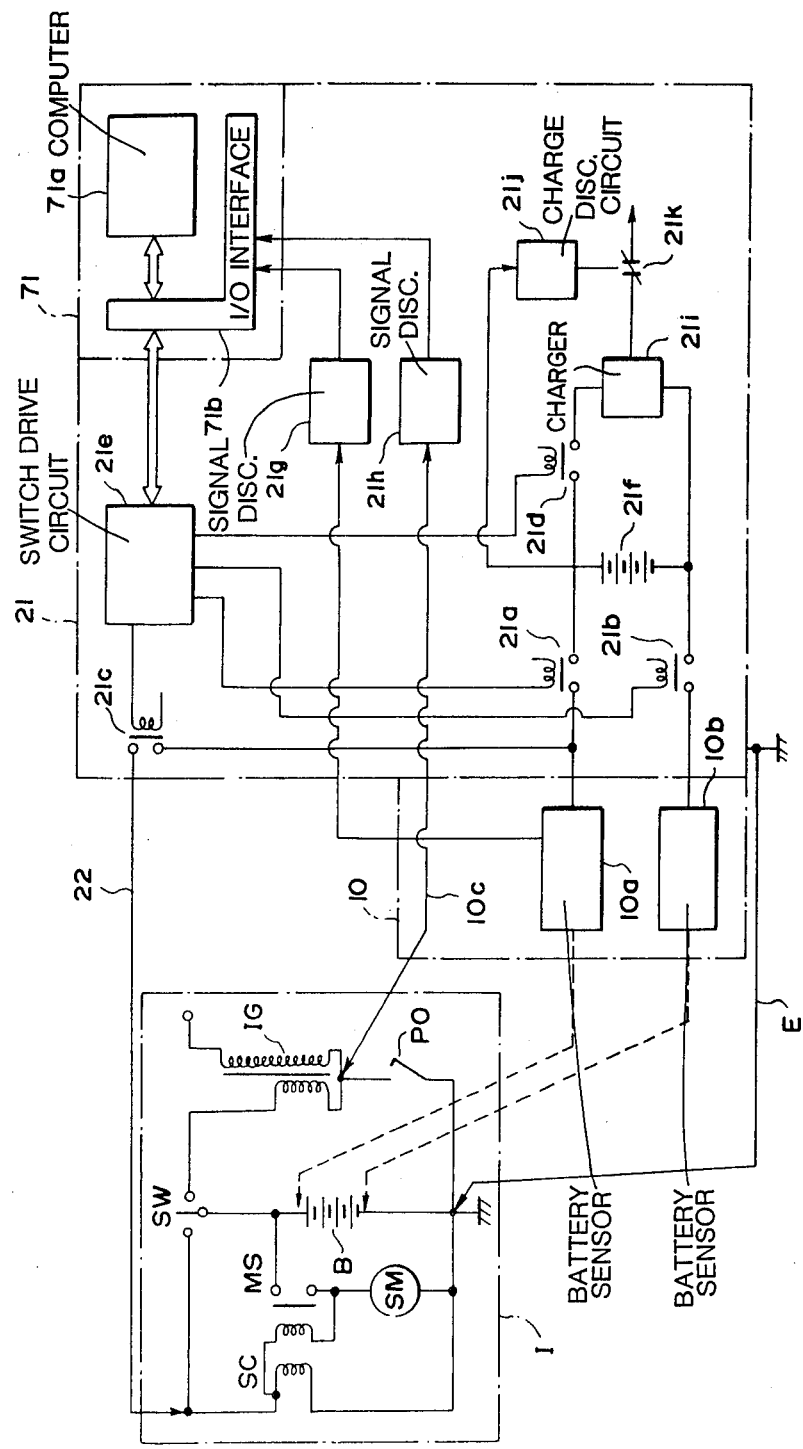
FIG. 2 is a block diagram showing an example of specific arrangement of the engine drive control section in the abovementioned embodiment.

Detailed description will hereunder be given of some of these characteristic functions with reference to the drawings. Firstly, a specific embodiment of the engine drive control section 20 constituting the first characteristic feature of the engine analyzer according to the present invention will be described with reference to FIG. 2.

In general, in an internal combustion engine and the like using a battery as an electric power source for an auxiliary engine, a vehicle-mounted battery is utilized for a power source at the time of starting or cranking (In this case the engine is merely rotated by a starting motor without starting it.) the internal combustion engine. It is difficult for these vehicle-mounted batteries to maintain their initial performance for a long period of time under the severe use conditions of the vehicles or the like, and they often become undercharge and have decreased service life. Consequently, it is well known that the batteries lowered in performance often tend to fail to start the engine, particularly in winter time. More specifically, as shown to the left in FIG. 2, a starting system of a general vehicle includes a starting motor SM, a starting coil SC and a magneto switch MS. To drive the engine, a key switch SW is operated to supply an electric current from the vehicle-mounted battery B to the starting coil SC. Then, a contact in the magneto switch MS is closed, whereby a high current is supplied from the battery B to the starting motor SM, so that the starting motor SM can be driven for rotation. Rotation of the starting motor SM causes a contact breaker PO operationally associated therewith in an ignition system to energize an ignition coil IG, so that the engine can be started. Consequently, if the battery B is low in performance at the time of starting the engine, then the battery B cannot rotate the starting motor SM. Furthermore, in the case compression pressures of the engine cylinders of the vehicle are measured in the inspection of the vehicle, generally, the engine is cranked and the compression pressures are measured with pressure gauges and the like. However, in case the battery B is lowered in performance, power required for cranking the engine is not supplied to the starting motor SM at a satisfactory level. Due to unsatisfactory cranking driving (The number of cranking rotations is decreased or cranking driving cannot be sustained.) it becomes often impossible to measure the compression pressures, which are aimed for the inspection.

In the past, when such cases occur that the engine starting failure and engine cranking drive failure due to lowered performance of the vehicle-mounted battery, a battery having an electric power equal to the initial performance of the vehicle-mounted battery is connected in parallel to the vehicle-mounted battery through electric wires, which allows a high current to flow therethrough, thus solving the aforesaid cases of failures. However, to obtain the abovedescribed parallel connection, a operator connects the vehicle-mounted battery directly to the external battery through the wires, spark discharges and mistaken connection tend to occur at the time of connection, thus resulting in a serious danger. Particularly, the mistaken connection of the current wires tends to cause the batteries to short-circuit itself, thus resulting in not only the wires are damaged but also the external battery is damaged.

Further, in an engine having an ignition circuit provided with a contact breaker, the contacting condition of the contact of the interrupter, the contact resistance or the condition of the capacitor connected in parallel with the contact breaker exert a very serious influence on the ignition performance of the ignition circuit, and hence, the engine is rotated to bring the contact of the contact breaker to the "CLOSED" position or "OPEN" position with the engine switch kept "OFF", whereby the measurement is carried out in accordance with the items of inspection. In inspecting the abovedescribed conditions of the contact breaker, heretofore, there has been no rotational angle control device capable of stopping the engine at a desirable angle of rotation, and hence, a crankshaft of the engine has been manually turned by use of a tool such as a wrench, or a fan belt has been pulled by hands to manually turn the crankshaft of the engine, so that the engine can be stopped at a desirable angle of rotation.

However, it has been difficult to manually turn the crankshaft of the engine in the condition where the ignition plugs are inserted. Hence, it has been necessary to turn the crankshaft in the state where the ignition plugs are removed and the air-fuel mixture is not compressed, thus considerably deteriorating the workability. Particularly, in order to stop the engine in the condition where the contact of the contact breaker is in the "CLOSED" or "OPEN" position, it is necessary to manually turn the engine in a condition where a cap portion of a distributor provided with the contact breaker is removed, visually observe the contact of the contact breaker and stop the engine in accordance with the condition of the contact of the contact breaker, thus requiring very complicated working.

The engine drive control section 20 according to the present invention has been arranged to obviate the disadvantages of the prior art, and, in a place for the maintenance or inspection of vehicles, whatever the batteries mounted on unspecified and many vehicles may be in their performance, the aforesaid engine starting or engine cranking can be accomplished, and the inspection and measurement in the engine starting condition or engine cranking condition can be performed.

Furthermore, the engine drive control section 20 according to the present invention has a function of preventing fastening means from being reversely connected to the vehicle-mounted battery, and is capable of safely and efficiently aiding the vehicle-mounted battery from outside the vehicle at the time of starting or cranking the engine.

The engine drive control section 20 according to the present invention can further carry out the cranking drive of the engine or the like from outside the vehicle without requiring the operation of a key switch of the engine, and consequently, functions to control the cranking drive of the engine from outside the vehicle as well as aiding the vehicle-mounted battery lowered in performance.

The engine drive control section 20 according to the present invention can maintain the capacity of an external power source constantly and satisfactorily, thus proving highly effective in aiding the vehicle-mounted battery tending to be appreciably lowered in performance.

Further, the engine drive control section 20 according to the present invention can actuate and control a driving circuit of the starting motor, stop the engine at a desirable angle of rotation and automatically stop the engine at the "CLOSED" or "OPEN" position of the contact breaker PO.

The engine drive control section 20 having several characteristic features described above, as shown in FIG. 2, consists of: switches 21a, 21b each having a contact of high current capacity; a switch 21c; a switch 21d; an auxiliary electric power source 21f having a potential equivalent to the vehicle-mounted battery; a charger 21i; a charge discriminator circuit 21j; a power relay 21k; a polarity discriminator circuit 21g; an electric continuity discriminator circuit 21h; and a switch drive circuit 21e.

With the component elements as described above, one point of contact of the switch 21a is connected to a battery sensor 10a, which is an element of the group of detectors 10. This battery sensor 10a is clip type fastening means for a high current capacity, and fastened to an anode portion of the battery B of the vehicle I to be diagnosed. The other point of contact of the switch 21a is connected to an anode portion of the auxiliary power source 21f. One point of the contact of the switch 21b having a function identical with that of the switch 21a is connected to a battery sensor 10b having a function identical with that of the battery sensor 10a, which in turn is fastened to a cathode portion of the vehicle-mounted battery B. The other point of contact of the switch 21b is connected to a cathode portion of the auxiliary power source 21f.

One point of contact of the switch 21c is connected to the engine control terminal 22, the forward end of which is fastened and connected to one end of the starting coil SC of the starting motor SM of the vehicle I to be diagnosed. The other point of contact of the switch 21c is connected to a portion between the switch 21a and the battery sensor 10a.

An input end of the polarity discriminator circuit 21g is connected to the battery sensor 10a, and an output from the polarity discriminator circuit 21g is fed to a computer 71a through an input-output interface 71b in the computer section 71.

An input end of the electric continuity discriminator circuit 21h is connected to a primary signal sensor 10c, which is an element of the group of detectors 10, and said primary signal sensor 10c is in turn fastened and connected to the primary end of the ignition coil IG in the ignition circuit of the vehicle I to be diagnosed. Furthermore, one point of contact of the switch 21d is connected to the auxiliary power source 21f and the other point of contact is connected to the charger 21i. Further, an input end of the charge discriminator circuit 21j is connected to an anode portion of the auxiliary power source 21f, and an output from the charge discriminator circuit 21j actuates the power relay 21k.

Further, the respective driving coils of the switches 21a, 21b, 21c and 21d are connected to the switch drive circuit 21e, an output of which is fed to the computer 71a through the input-output interface 71b. Furthermore, a ground E of the engine drive control section 20 is connected to a ground of the vehicle I to be diagnosed.

In the engine drive control section 20 with the abovedescribed arrangement and connections, in order to simplify the general arrangement of the system and reduce the costs, it is desirable to form the auxiliary power source 21f into a battery, in which the initial performance equivalent to the vehicle-mounted battery B can be maintained. Consequently, operation of the power source 21f of the engine drive control section 20 in the engine analyzer of the present invention will be described with reference to an embodiment using the battery.

Normally, in operation of the main body III of the engine analyzer, in accordance with a preset program in the computer 71a, a command signal from the computer 71a actuates the switch circuit 21e through the input-output interface 71b, and only the contact of the switch 21d is closed. Consequently, the charger 21i is connected to the auxiliary power source 21f to charge the auxiliary power source 21f, which is a battery. On the other hand, connected to the anode of the auxiliary power source 21f is the charge discriminator circuit 21j, and hence, when the auxiliary power source 21f is charged in voltage above a preset value, i.e., to the condition of satisfactorily charged, the charge discriminator circuit 21j operates to send out an output to turn the power relay 21k off. When the auxiliary power source 21f is used and a terminal voltage of the auxiliary power source 21f is lowered to less than the preset value, the charge discriminator circuit 21j operates to send out an output to turn the power relay 21k on, whereby the charger 21i charges the auxiliary power source 21f. Consequently, the auxiliary power source 21f, which is the battery, is constantly controlled to be fully charged.

Description will hereunder be given of the cases the vehicle I to be diagnosed in set in an engine cranking condition, an engine starting condition or a condition where the contact breaker PO of the ignition circuit is set at the "CLOSED" or "OPEN" position, with the engine control terminal 22 being fastened to a portion of the starting coil SC of the starting motor SM, the primary signal sensor 10c fastened to the primary coil of the ignition coil IG and the battery sensors 10a, 10b fastened to the anode and cathode of the vehicle-mounted battery B, respectively.

When a command signal to crank the engine is sent out from the computer 71a, firstly, in accordance with a preset program, a command signal to cut the charger 21i off, whereby the switch drive circuit 21e is operated through the input-output interface 71b and the switch 21d is cut off.

Next, when a polarity discriminating signal of that the battery sensor 10a is positively fastened to the anode portion of the vehicle-mounted battery B is sent out from the polarity discriminating signal 21g and fed to the computer 71a through the input-output interface 71b, the computer 71a sends out signals for actuating the switches 21a, 21b in response to the polarity discriminating signal. These actuating signals actuates the switch drive circuit 21e through the input-output interface 71b to set the switches 21a, 21b at the "CLOSED" positions. Consequently, the auxiliary power source 21f being in the fully charged condition will be connected in parallel with the vehicle-mounted battery B of the vehicle I to be diagnosed through the switches 21a, 21b and battery sensors 10a, 10b. Consequently, the power of the auxiliary power source 21f can be fed to the vehicle I to be diagnosed.

Furthermore, in case the battery sensor 10a is mistakenly connected to the cathode of the vehicle-mounted battery B or short-circuited to the engine body or the like, the polarity of the potential applied to the battery sensor 10a is discriminated by the polarity discriminator circuit 21g, whereby the mistaken connection is determined by the computer 71a, so that the switches 21a, 21b will not be actuated.

Consequently, such possibilities can be completely eliminated that the auxiliary power source 21f is short-circuited to ground of the vehicle I to be diagnosed due to the mistaken connection of the group of detectors 10, and the switches 21a, 21b and the polarity discriminator circuit 21g can display a very powerful effect when an additional supply of power from the external power source is made to the vehicle-mounted battery B deteriorated in performance.

As described above, when the cranking or driving of the engine is performed in the condition where the auxiliary power source 21f is connected in parallel to the vehicle-mounted battery B, a command signal from the computer 71a, actuates the switch drive circuit 21e and the switch 21a is closed. Consequently, the potential of the auxiliary power supply 21f is fed to the engine control terminal 22 through the switches 21a and 21c, applied to the starting coil SC of the starting motor SM through the engine control terminal 22. With the operation as descried above, the power is supplied from the engine drive control section 20 to the starting motor SM to rotate the starting motor without requiring the operation of the engine key switch SW of the vehicle I. Consequently, even if the vehicle-mounted battery B is deteriorated in performance, the vehicle-mounted battery B, upon receiving the additional supply of power from the auxiliary power source 21f, can rotate the starting motor, and further, can display highly effective effect in the inspections in the engine starting or engine cranking condition because of not requiring the operation of the engine key switch.

Further, in the case of inspecting the state of the ignition circuit of the vehicle I to be diagnosed, the contact of the contact breaker PO in the ignition circuit is frequently set at the "OPEN" position. However, in the engine drive control section 20 according to the present invention, when a command signal to close the contact breaker PO is sent out by the computer 71a, pulse signals having a given cycle and a given time length are supplied through the input-output interface 71b to actuate the switch drive circuit 21e. Consequently, the switch 21c is intermittently closed to rotate the starting motor SM through a given angle intermittently. This intermittent rotation of the starting motor SM causes the rotary shaft of the contact breaker PO connected to the starting motor SM to be rotated through a given angle, whereby the closing or opening of the contact of the contact breaker PO is regulated to very small intervals. And, when the contact of the contact breaker PO is closed, the electric continuity discriminator circuit 21h is actuated, whereby a discriminating output from the electric continuity discriminator circuit 21h is fed to the computer 71a through the input-output interface 71b. Consequently, the computer 71a, upon receiving the discriminating signal stops to send out the command signal for the switch drive circuit 21e, and the contact of the contact breaker PO is automatically set at the "CLOSED" position. Needless to say that the contact of the contact breaker PO may be automatically set at the "OPEN" position.

As described hereinabove, the engine drive control section 20 of the engine analyzer according to the present invention has several functions displaying highly effective effects, and hence, can offer considerable advantages in inspecting and diagnosing the unspecified and many vehicle.

Figure 3:
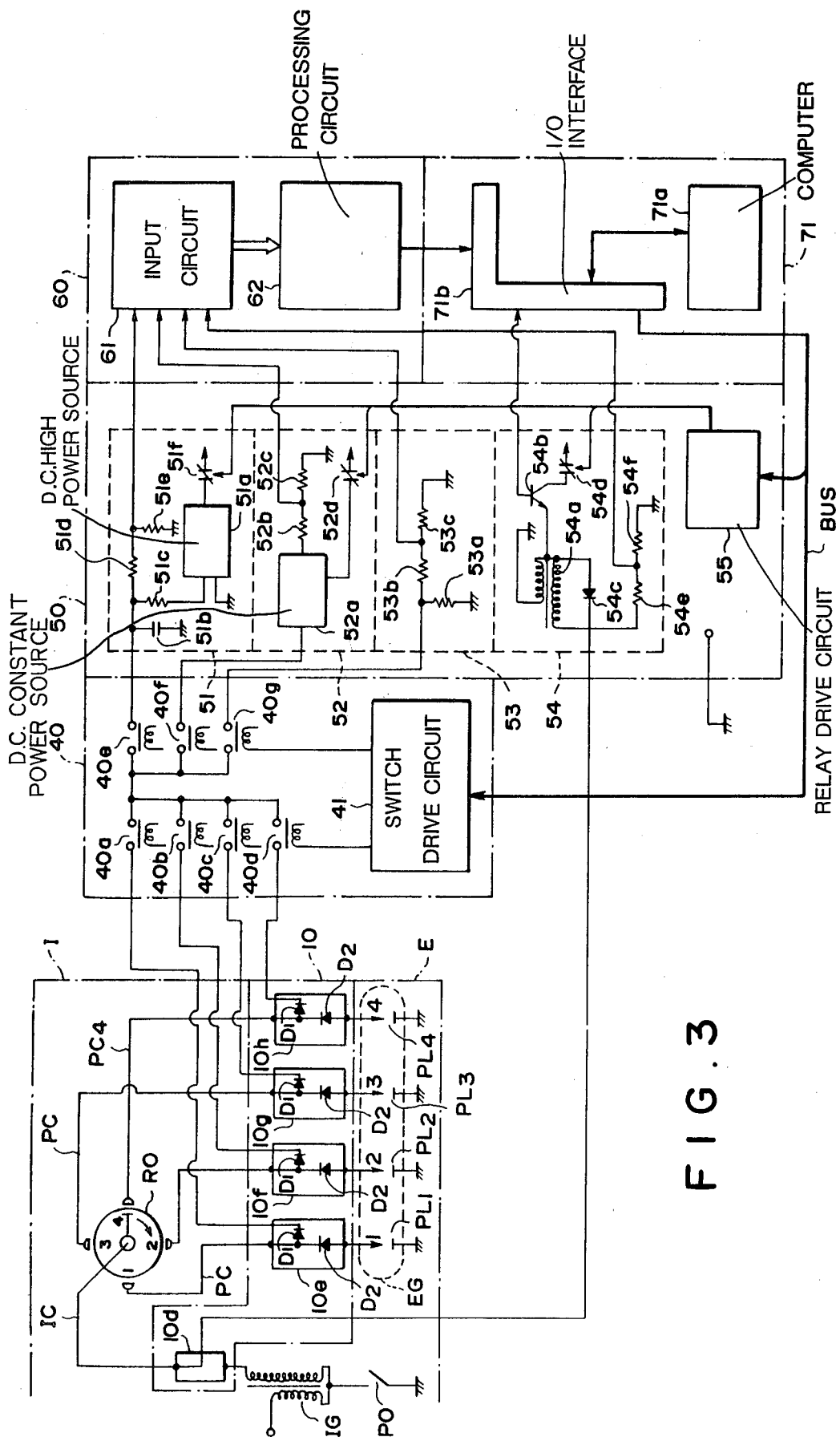
FIG. 3 is a block diagram showing an example of arrangement of the multi-cylinder engine inspecting means in the abovementioned embodiment.

Description will hereunder be given of an embodiment specifically showing the multi-cylinder engine inspecting means consisting of the switching circuit 4 and the inspecting power source 5, constituting the second characteristic feature of the engine analyzer according to the present invention, which is suitable for inspecting and diagnosing the state of the respective cylinders of the vehicle I to be diagnosed, on which the multi-cylinder engine is mounted, with reference to FIG. 3.

In general, the high voltage ignition type ignition circuit of the multi-cylinder internal combustion engine has high voltage sections for feeding a high voltage of 10 KV generated at the secondary coil of the ignition coil IG to the ignition plugs of the respective cylinders through the coil cord IC, distributor RO and plug cords PC for the respective cylinders and causing electrodes of the ignition plugs PL to generate spark discharges for the operation of the engine. Consequently, to constantly maintain the elements constituting these high voltage circuit sections in normal conditions is an essential requirement for normally operating the internal combustion engine. For example, in case a plug cord PC of a cylinder is disconnected or an ignition plug PL of a cylinder is too much sooty, the high voltage generated at the ignition coil IG will not be sufficiently fed to the cylinder, to which the defective plug cord PC or the ignition plug PL is fastened, thereby causing a misfire or the like to the cylinder. Therefore, even if part of the elements constituting these high voltage circuit sections is defective, the internal combustion engine may not attain the normal operation.

Heretofore, in inspecting the high voltage circuit sections, there has been obserbed such a practice that, in the idling condition or the like of the engine, the operator determines a misfire of other from the conditions of rotation of the engine, such as the vibration of the engine and the fluctuation in the number of rotation, and, upon stopping the engine, removes from the engine the plug cords PC, the ignition plugs PL and the like, which are measured by use of suitable measuring instruments or inspected visually. However, such a practice that the plug cords PC, the ignition plugs PL and the like are removed from the engine and separately inspected is low in the workability and the operating efficiency. Further, in the case a misfire and the like are found with the engine due to some defect in the high voltage circuit sections, it may be sufficient to resort to the conventional method of inspection as described above. However, in the case the misfire of the engine is caused from some defect in the intake system or the compression system, the abovedescribed conventional inspection method is completely ineffective, thus wasting the whole amount of labor required for the inspection.

More specifically, heretofore, in inspecting the spark gaps of the ignition plugs PL, there has been practised that the ignition plugs PL are removed from the engine EG at the time of the maintenance or inspection of the vehicle, and measured by use of a gap measuring tool referred to as "a thickness gauge". Consequently, in the case of the multi-cylinder engine, the ignition plugs of the respective cylinders have been manually inspected by the operator, thus resulting in very low workability. Further, the differences of one operator to another are reflected in the measurement of the spark gaps of the ignition plugs which may result in errors in the measurement, thus not resulting in correct inspection.

Furthermore, in inspecting the resistances of the ignition plugs PL at the time of maintenance or inspection of the vehicle, there has been practised that the ignition plugs are removed from the engine, a plurality of ignition plugs in the multi-cylinder are inspected one after another by use of an insulation resistant tester or the like, or the plug cords PC connected to the ignition plugs are removed in the condition where the ignition plugs are actually fastened to the engine EG, and inspected on one cylinder to another by use of the insulation resistance tester or the like. Consequently, the practice of inspecting a multiplicity of ignition plugs PL in the multi-cylinder engine has been very low in workability and operating efficiency.

Particularly, according to the conventional method of removing the ignition plugs from the engine and inspecting them on one cylinder to another by use of the insulation resistance tester, after all of the many ignition plugs are inspected in the multi-cylinder engine, and only the ignition plugs lowered in resistance should be selected, resulting in inspection of even the non-defective ignition plugs, thus requiring a considerable amount of labor.

Further, in the case the resistance value of an ignition plug is inspected in each cycle of repeated engine stop and engine running in a durability test or the like of the ignition plug, the ignition plug must be removed from the stopped engine each time and inspected so that the operating efficiency is very low.

Furthermore, there has been known a device for measuring and inspecting the changes of resistance in the ignition plugs during running of the engine in addition to the conventional devices as described above. However, all of the conventional devices are of such an arrangement that such a device is fastened to an ignition plug of the respective cylinder of the multi-cylinder engine for the inspection, the devices themselves are expensive, with the result that the devices are not suitable for the inspection of the ignition plugs at the time of maintenance or inspection of the general vehicles.

The multi-cylinder engine inspecting means according to the present invention has been developed to obviate the disadvantages of the prior art, and is capable of successively measuring and inspecting without requiring for removing the ignition plugs and the like from the high voltage circuit sections and highly excellent in the operability and safety.

Detailed description will hereunder be given of the multi-cylinder engine inspecting means according to the present invention, which is applied to a four cylinder internal combustion engine with reference to the drawings. The switching circuit section 40 constituting the multi-cylinder engine inspecting means, as shown in FIG. 3, includes high voltage switches 40a, 40b, 40c, 40d, 40e, 40f and 40g each having a contact capable of bearing a high voltage and a switch drive circuit 41 for actuating these high voltage switches. The high voltage switch 40a is provided corresponding to a first cylinder of the vehicle I to be diagnosed, the high voltage switch 40b to a second cylinder, the high voltage switch 40c to a third cylinder and the high voltage switch 40d to a fourth cylinder. One point of contact of the high voltage switch 40a is connected to a diagnosing probe 10e which is an element of the group of detector 10 fastened to a portion between the ignition plug PL and the plug cord PC of the first cylinder of the engine EG. Likewise, one point of contact of the high voltage switch 40b to a diagnosing probe 10f of the second cylinder, one point of contact of the high voltage switch 40c to a diagnosing probe 10g of the third cylinder and one point of contact of the high voltage switch 40d to a diagnosing probe 10h of the fourth cylinder, respectively.

Additionally, the other points of contact of the high voltage switches 40a, 40b, 40c and 40d are collectively connected to a collectively connected point of points of contact of the high voltage switches 40e, 40f and 40g. The other points of contact of the high voltage switches 40e, 40f and 40g are separately connected to the inspecting power source device 50 at the succeeding stage.

Consequently, the high voltage switches 40a, 40b, 40c and 40d out of the high voltage switches in the aforesaid switching circuit section 40 perform the functions of the switches for the respective cylinders of the engine EG and the high voltage switches 40e, 40f and 40g thereof perform the functions of the inspecting switches corresponding to the purposes of inspection of the ignition circuits.

Furthermore, the diagnosing probes 10e, 10f, 10g and 10h of the group of detectors 10 are of the arrangement identical with one another, having incorporated therein diodes $D_1$, $D_2$ for the high voltage. More specifically, the diode $D_2$ is oriented between the plug cord PC and the ignition plug PL in a manner that a negative potential can be applied from the plug cord PC to the ignition plug PL, and the diode $D_1$ is oriented in a manner that a negative potential applied to a conductive portion of the diagnosing probe is prevented so as not to be applied to the switching circuit section 40.

In the diagnosing probes 10e through 10h with the arrangement as described above, a negative high voltage of several 10 KV generated at the ignition coil IG of the high voltage circuit section of the vehicle I to be diagnosed is applied to the ignition plug PL through the diode $D_2$ in the diagnosing probe, therough the coil cord IC, distributor RO and plug cord PC. However, such an action is observed that the negative high voltage is prevented and not applied to the switching circuit section 40 through the agency of the diode $D_1$ in the diagnosing probe.

The switch drive circuit 41 is actuated by a command signal from the computer 71a through the input-output interface 71b and a bus line BUS, and actuates the high voltage switches 40a, 40b, 40c, 40d, 40e, 40f and 40g either solely or combinedly.

Next, as shown in FIG. 3, the inspecting power source device 50 constituting the multi-cylinder engine inspecting means includes: a first inspecting section 51 consisting of a DC high voltage power source 51a, a capacitor 51b, resistors 51c, 51d, 51e and a power relay 51f; a second inspecting section 52 consisting of a DC constant voltage power source 52a, resistors 52b, 52c and a power relay 52d; a third inspecting section consisting of resistors 53a, 53b and 53c; a fourth inspecting section consisting of a boosting transformer 54a, a diode 54c, a transistor 54b, a power relay 54d and resistors 54e, 54f; and relay drive circuit 55 for actuating the power relays 51f, 52d and 54d in response to a command signal fed from the input-output interface 71b of the computer section 71, and the respective output signals from the first, second, third and fourth inspecting sections 51, 52, 53 and 54 are fed to the input circuit 61 of the signal process circuit 60. Further, the other points of contact of high voltage switches 40e, 40f, 40g of the switching circuit section 40 are connected to input terminals of the first, second and third inspecting sections 51, 52 and 53, respectively. Additionally, on output end of the boosting transformer 54a of the fourth inspecting section 54 is connected to a diagnosing attachment 10d, which is an element of the group of detectors 10.

The diagnosing attachment 10d is fastened to a portion between the coil cord IC and the ignition coil IG, and has such a function as to apply positive high voltage pulses generated in the inspecting section 54 to the high voltage circuit section after the coil cord IC without applying the positive high voltage pulses to the ignition coil IG.

Description will hereunder be given of a specific example for inspecting and diagnosing the state of the high voltage circuit section of the ignition circuit of the vehicle I to be diagnosed with the diagnosing probe 10e through 10h, switching circuit section 40 and inspecting power source device 50 as arranged and connected as described above.

In this embodiment, description will be given of actions of the respective elements in the cases that the inspection and diagnosis are conducted on a discharge voltage Vs at electrodes of the ignition plug PL in the high voltage circuit section of the ignition circuit, an insulation resistance Rg of the ignition plug PL, a cord resistance RC in the high voltage cord section consisting of the coil cord IC and plug cord PC and voltage leakage in the high voltage circuit in accordance with a program preset in the computer 71a.

Firstly, description will be given of the case when a discharge voltage Vs in the ignition plug PL is to be inspected and diagnosed. The switch drive circuit 41 is actuated in response to a programmed command signal from the computer 71a through the input-output interface 71b, whereby only the inspecting switch 40e is actuated. Next, the relay drive circuit 55 is actuated in response to a command signal from the computer 71a, whereby only the power relay 51f is actuated. With the setting as described above, the DC high voltage power source 51a for generating the negative voltage is started, and a capacitor 51b is charged with an output from the power source 51a through a resistor 51c.

Next, when the first cylinder switch 40a is closed in response to a command signal from the computer 71a, the negative high voltage charged in the capacitor 51b, passing through the inspecting switch 40e, the first cylinder switch 40a and the diodes $D_1$, $D_2$ of the diagnosing probe 10e, is applied to the electrode portion of the ignition plug PL, and, upon reaching the dielectric breakdown voltage Vs between the sprak gap of the ignition plug PL, the spark gap of the ignition plug PL generates spark discharges. Consequently, the discharged voltage in the capacitor 51b is discharged in a closed circuit of the inspecting switch 40e—first cylinder switch 40a—diagnosing probe 10e—ignition plug PL, thus being lowered in value quickly. However, the capacitor 51b is constantly charged by the DC high voltage power source 51a through the resistor 51c, whereby a negative high voltage is charged in the capacitor 51b again, which is fed to the ignition plug PL by the closed circuit, and discharged again at the discharge voltage Vs of the ignition plug PL. Namely, the charge is repeated by the charging circuit consisting of the resistor 51c and capacitor 51b and the discharge is repeated by the discharging circuit consisting of the capacitor 51b, inspecting switch 40e, first cylinder switch 40a, diagnosing probe 10e and ignition plug PL, whereby a serrate-wave shaped discharge voltage is generated between the opposite ends of the capacitor 51b. According to Paschen's law, the value of the discharge voltage is in proportion to the size of the spark gap, and hence, the discharge voltage Vs is measured and determined, so that the inspection of the spark gap of the ignition plug PL can be conducted as to whether the spark gap is normal or not. The discharge voltage Vs normally being several KV is converted into a low voltage signal suitable for the signal processing by use of a voltage divider circuit consisting of resistors 51d and 51e, fed to the input circuit 61 of the signal process circuit section 60, converted into an electric signal to be easily processed by the computer by use of the processing circuit 61, and fed to the computer 71a through the input-output interface 71b. The computer 71a discriminates between the good or bad condition of the discharge voltage Vs of the ignition plug PL in accordance with a preset program of the discriminating standards, and stores the discriminated results and the value of the discharge voltage Vs during operation of the engine analyzer.

Upon the completion of inspecting and measuring the discharge voltage Vs of the ignition plug PL of the first cylinder for a period of programmed time, the computer 71a sends out a command signal to measure the discharge voltage Vs of the ignition plug $PL_2$ of the second cylinder. In response to the command signal to the second cylinder, the switch drive circuit 41 is actuated, the first cylinder switch 40a is opened and the second cylinder switch 40b is closed. Consequently, the negative high voltage charged in the capacitor 51b is discharged by a closed circuit consisting of an inspecting switch 40e, the second cylinder switch 40b, the diagnosing probe 10f and the ignition plug $PL_2$, and the discharge voltage Vs of the second cylinder ignition plug $PL_2$ is inspected and measured by the actions similar to the case of the first cylinder.

Subsequently, the computer 71a sends out command signals for the third and fourth cylinders successively and at desirable time intervals, whereby the third cylinder switch 40c and fourth cylinder switch 40d are successively actuated, so that the discharge voltages Vs of the ignition plugs PL of the third and fourth cylinders can be inspected and measured.

After the discharge voltages Vs of the ignition plugs PL of all the cylinders are measured, in response to a command signal from the computer 71a, the cylinder switches, inspecting switch 40e and power relay 51f are opened. As a matter of course, the respective discharge voltages Vs and discriminated results of all the cylinders are stored by the computer 71a.

Upon the completion of measuring the discharge voltage Vs of the ignition plugs PL as described above, the computer 71a sends out a command signal to measure the insulation resistance Rg of the ignition plug. Through the input-output interface 71b, this command signal actuates the relay drive circuit 55 and switch drive circuit 41, which is turn actuate the power relay 52d and inspecting switch 40f, respectively. Under this condition of setting, the DC constant voltage power source 52a for generating the negative voltage is started. When the first cylinder switch 40a is closed in response to the succeeding command signal from the computer 71a, a negative voltage from the DC constant voltage power source 52a is applied to the ignition plug $PL_1$ through the inspecting switch 40f, the first cylinder switch 40a and the diodes $D_1$ and $D_2$ in the diagnosing probe 10c. Consequently, a closed circuit consisting of the DC constant voltage power source 52a, the inspecting switch 40f, the first cylinder switch 40a, the diagnosing probe 10e, the first cylinder ignition plug $PL_1$, the engine's body ground E and the load resistors 52c, 52b. If the resistance values of the load resistors 52c, 52b are supposed to be constant, a current in proportion to the insulation resistance Rg of the ignition plug $PL_1$ flows through the aforesaid closed circuit.

The current flowing through the aforesaid closed circuit is taken out from the opposite ends of the load resistor 52c as a voltage signal, and fed to the input circuit 61 of the signal process circuit 60 as a signal corresponding to the insulation resistance Rg of the ignition plug $PL_1$, and, after being converted into an electric signal to be easily processed by the computer by use of the processing circuit 61, fed to the computer 71a through the input-output interface 71b. The computer 71a discriminates the magnitude of the signal corresponding to the isolation resistance Rg of the ignition plug PL in accordance with the reference value preset in the program, and stores the values of isolation resistance Rg and the discriminated results. After the value of isolation resistance Rg of the ignition plug $PL_1$ of the first cylinder is measured for a period of time preset in the computer 71a, the second cylinder switch 40b, the third cylinder switch 40c and the fourth cylinder switch 40d are actuated successively and at desirable time intervals, successively, and the values of isolation resistance Rg of the ignition plugs PL of all the cylinders are measured. And, after the values of isolation resistance of the igniton plugs of all the cylinders are measured, in response to a command signal of the completion from the computer 71a, the cylinder switches, inspecting switch 40f and power relay 52d are opened, and, as a matter of course, the values of isolation resistance of the ignition plugs of the respective cylinders and the discriminated results are stored by the computer 71a, and then, the succeeding inspection and diagnosis follow.

Upon the completion of measuring the values of isolation resistance Rg of the ignition plugs PL as described above, the computer 71a sends out a command signal to measure the resistance Rc of the high voltage cords including the coil cord IC and plug cord PC. The command signal from the computer 71a actuates the relay drive circuit 55 and switch drive circuit 41 through the input-output interface 71b, whereby the power relay 54d, inspecting switch 40g and all the cylinder switches 40a, 40b, 40c and 40d are actuated, respectively. Upon the completion of setting as described above, the computer 71a sends out an engine cranking drive signal, whereby the engine is cranked utilizing the aforesaid engine drive control section 20. Although not shown in FIG. 3, in this cranking condition, a primary signal is detected from the primary coil of the ignition coil IG by the aforesaid primary signal sensor 10c, this primary signal is fed to the computer 71a through the signal process section 60. Then, pulse signals synchronized with the primary signal by the computer 71a are fed to the transistor 54b of the inspecting section 54 through the input-output interface 71b. Consequently, a pulse generating power source constituted by the boosting transformer 54a and transistor 54b is actuated, whereby positive high voltage pulses synchronized with the primary signal is send out from the output terminal of the boosting transformer 54a. These positive high voltage pulses are supplied to the coil cord IC through the diagnosing attachment 10d. Since the distributor RO is rotated by the cranking of the engine, the high voltage pulses establishes an electric continuity between electrodes by spark discharges at a position where a rotary electrode and an external electrode of the distributor RO are opposed to each other (The position, where the rotary electrode and the external electrode are opposed, which coincides with the ignition timing because the high voltage pulses are generated in synchronism with the rise portion of the primary signal), and this electric continuity between the electrodes causes the high voltage pulses to be applied to the diagnosing probes of the respective cylinders in a preset ignition order (normally, 1-3-4-2) through the plug cords PC. When the distributor RO is opposed to the fourth cylinder for example, the aforesaid positive high voltage pulses are applied to the resistor 53a by way of the diode $D_1$ incorporated in the diagnosing probe 10h of the fourth cylinder through the fourth cylinder switch 40d and inspecting switch 40g. By setting the resistor 53a at a constant load resistance, the positive high voltage pulses applied by the diagnosing attachment 10d to the coil cord IC are divided in voltage by the resistance values of the coil cord IC and the plug cord PC and the load resistance 53a. Consequently, the value of the positive high voltage pulses fed from the boosting transformer 54a is detected by the voltage divider circuit consisting of the resistors 54e and 54f which are connected to the boosting transformer 54a, this output signal is fed to the signal process section 60, further, a signal generated between the opposite ends of the load resistance 53a is detected by the voltage divider circuit consisting of the resistors 53b and 53c, this output signal is fed to the signal processing section 60, and both signals are calculated by the computer 71a, so that the resistance RC of the aforesaid coil cord IC and plug PC can be measured.

In the measurement of the resistance of the high tension cord according to the present invention, the value of discharge resistance resulted from the spark discharges between the rotary electrode and the external electrode of the distributor RO still exists as a measuring error. However, this error can be readily corrected at the time of calculation in the computer 71a by previously, experimentally determining.

Subsequently, the rotation of the distributor RO by the engine cranking makes it possible to successively measure the resistances of the cylinders which will follow. For the purpose of improving the accuracies in measuring the cord resistances in the cylinders, the computer 71a calculates the average value for several measuring values of the cylinders.

Although there is not shown in FIG. 3, a first cylinder signal is detected by a clip type trigger sensor inductively or capacitively coupled to a portion of the plug cord $PC_1$ of the first cylinder, and fed to the computer 71a as a reference cylinder signal. Consequently, a signal generated between the opposite ends of the aforesaid load resistance 53a is fed in a preset ignition order to the computer 71a through the signal processing section 60, and hence, selected and processed into a signal synchronized with each cylinder as referenced from the reference cylinder signal (of the first cylinder) in the computer 71a.

As described hereinabove, the present invention can offer cord resistance inspecting means very simplified in handling and excellent in controllability, wherein the resistance values RC of the high tension cords of the respective cylinders can be measured merely by bringing the engine into the cranking condition without requiring for removing the high tension cords from the engine.

Upon the completion of measuring the high tension cord resistances of all the cylinders by the actions as described above, the resistance values of the high tension cords of the respective cylinders and the results of comparing those resistance values of the high tension cords of the respective cylinders with the reference value preset in the computer 71a are stored in the computer 71a.

Then, the computer 71a sends out a command signal of the completion of measuring the resistance values of the high tension cords, the aforesaid engine drive control section 20 is stopped in operation, simultaneously with the stop of engine cranking, all of the aforesaid cylinder switches 40a, 40b, 40c, 40d inspecting switch 40g and power relay 54d are opened, and the succeeding inspection and diagnosis follow.

Next, the computer 71a sends out a command signal for the inspection of voltage leakage in the high voltage circuit section consisting of the coil cord IC, distributor RO and plug cord PC.

When this command signal is sent out through the input-output interface 71b, the relay drive circuit 55 is actuated to operate the power relay 54b only. Upon the completion of this setting, the engine drive control section 20 is actuated to crank the engine quite similarly to the measurement of the aforesaid high tension cord resistances. During the engine cranking, in response to a primary signal detected from the primary coil of the ignition coil IG, the computer 71a, in synchronism therewith, causes the boosting transformer 54a to generate the positive high voltage pulses. These positive high voltage pulses are applied to the diagnosing prove through the diagnosing attachment 10d, coil cord IC, distributor RO and plug cord PC. In the diagnosing probe, the positive high voltage pulses are prevented by the reverse characteristics of the diode $D_2$ incorporated in the diagnosing probe and are not supplied to the ignition plug PL. However, the diode $D_1$ being in the right order passes and applies the positive high voltage pulses to the cylinder switch. However, contacts of all the cylinders are opened and the withstand voltage of the contact of the aforesaid cylinder switch is held sufficiently high, whereby the aforesaid positive high voltage pulses are prevented by the contact of the cylinder switch.

By the actions as described above, the positive high voltage pulses generated by the boosting transformer 54a in synchronism with the primary signal during the engine cranking are applied to the high voltage circuit section consisting of the coil cord IC, distributor RO and plug cord PC, all of which are competely shut off from the ground, through the diagnosing attachment 10d. Consequently, the voltage values in withhold voltage of these high voltage circuit sections are detected by the voltage divider circuit consisting of the resistors 54e and 54f, which are connected to the output terminal of the boosting transformer 54a, and fed to the computer 71a through the signal processing section 60. As a matter of course, in case an abnormality such as a cracking in the high tension cord occurs in part of the high voltage circuit section and the positive high voltage pulses applied thereto leak to the engine body ground E and the like, the value of voltage leaking at the time of leakage is fed to the computer 71a.

As the result, such effective inspecting means can be provided that the high voltage pulses are supplied to the elements of all the high voltage circuit sections by the engine cranking in a condition where the high voltage circuit sections of the ignition circuit are completely shut off from the grounding, so that the voltage leakage and the like in the high voltage circuit sections can be very simply inspected and measured.

As described in the embodiment of FIG. 3, the multi-cylinder engine inspecting means and the inspecting mechanism consisting of the switching circuit section 40, inspecting power source device 50 and group of detectors 10 including diagnosing probes and diagnosing attachments, which are connected to the inspecting power source device 50 in the engine analyzer according to the present invention can inspect and diagnose very simply and with high controllability the date of the high voltage circuit sections such as the coil cord IC, distributor RO, plug cord PC and ignition plug PL in the ignition circuits of the multi-cylinder engine.

Description will hereunder be given of the remote control section 30, which is the third characteristic feature of the engine analyzer according the the present invention with reference to the drawings. As aforesaid, this remote control section 30 has a function of allowing the operator to remotely control the main body III of the engine analyzer according to the present invention and further has a timing light function for measuring the ignition timing of the engine with a falsher incorporated in the remote control section 30.

Heretofore, in order to regulate the ignition timing, there has been generally practised a method of using a periodic flasher, which is so-called timing light. The publicly known timing light is composed of the main elements including a discharge flasher, a power source for supplying a high voltage for flashing and a trigger circuit for triggering the discharge flasher in response to the ignition timing of the engine. A strobo-light generated by the discharge flasher and synchronized with the ignition signal of the first cylinder is illuminated onto a crank pulley of the rotating engine, whereby a timing mark provided at a position corresponding to the top dead center of the crank pulley is made to look as if it is static as viewed from the operator, so that the operator can visually measure the angular difference between the timing mark and the mark of top dead center provided on the engine block, with an angle gauge provided on the engine block, thereby enabling the operator to measure the angle of the ignition timing against the top dead center.

However, in the conventional measurement of ignition timing as described above, the measurement is relied upon only the eyesight of the operator, the accuracies of the measured date are low, and the working for recording the measured data is needed additionally, thus presenting such disadvantages that the working becomes complex, a long period of time is required for the measureing and the working efficiency is low. In the conventional diagnoser, such as an engine analyzer, the remote switch section for remotely controlling the diagnoser and the timing light should be simultaneously operated in measuring the ignition timing because the two elements are separately provided, thus presenting very low workability.

The remote control section 30 according to the present invention has been arranged to obviate the abovedescribed disadvantages of the prior art, and can alleviate the burden imposed on the operator in measuring and improve the working efficiency.

According to the present invention, a discharge flasher and a commander for giving a simple command to measure are integrally united to constitute the remote control section 30, the timing calculation for determining a flash timing of the discharge flasher in response to the command from the commander is performed by the main body III of engine analyzer, so that the measuring and storage of the ignition timing can be combinedly performed in the main body III of engine analyzer. Consequently, in order to measure the ignition timing with comparatively high accuracy, the operator needs only to perform a simple mark position mating operation with the remote control section 30. Further, according to the present invention, the discharge flasher is separated from the power circuit for feeding the flashing high voltage power thereto and only the discharge flasher is combined with the remote control section 30, so that the remote control section 30 can be decreased in volume and weight, thereby improving the controllability of the engine analyzer.

Figure 4:
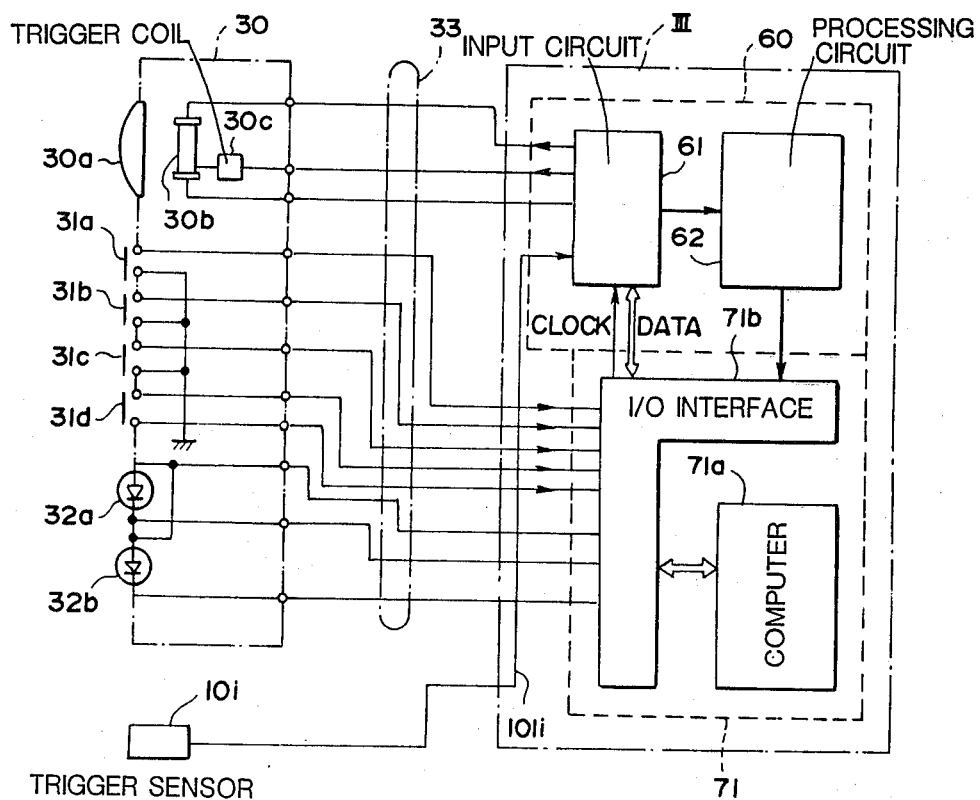
FIG. 4 is a circuit diagram showing an example of specific arrangement of the remote control section in the abovementioned embodiment.
Figures 5A, 5B:
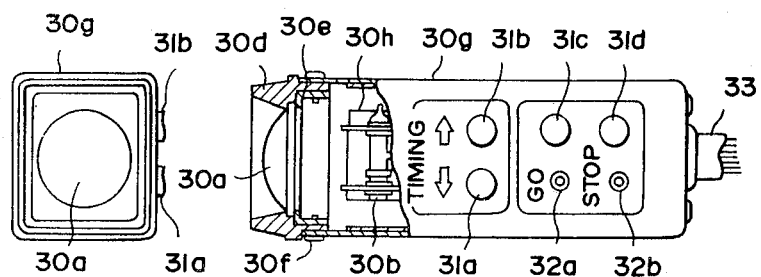
FIGS. 5A and 5B comprise the outer appearance thereof.

Detailed description will hereunder be given of the remote control section 30 according to the present invention. FIG. 4 shows the arrangement of the engine analyzer consisting of the remote control section 30 and the main body III, and the remote control section 30 is electrically connected to the main body with a connecting wires having a length of several meters. FIG. 5 shows a specific arrangement of the remote control section 30.

In the remote control section 30, disignated at 30a is a convex lens and 30b a Xenon tube. The convex lens 30a illuminates the light of the Xenon tube 30b for discharge-flashing to the outside. The discharge flasher is constituted of the focusing convex lens 30a, the Xenon tube 30b and a trigger coil 30c for triggering the Xenon tube 30b for flashing.

Designated at 31a, 31b, 31c and 31d are automatic reset press button type switches, with which the operator issues command signals to the main body III, with the alloted tasks of "go" to the switch 31c, "stop" to the switch 31d, "lead angle" to the swich 31a and "lag angle" to the switch 31b, respectively. Out of those switches, provided adjacent to "go" switch 31c and "stop" switch 31d are flashing diodes 32a and 32b, which, with the progress of the measuring program handled by the main body III, is turned on, off or flickers to request the operator to perform some work or to show the process of measuring.

As illustrated in FIG. 5 showing the mechanical arrangement of the remote control section 30, the focusing lens 30a is held by the resistors 30d and 30e, and solidily secured to an end portion of a case 30g. The aforesaid Xenon tube 30b is secured to a holder 30h and fixed on the case 30g.

The Xenon tube 30b is excited to flash by the trigger coil 30c in response to an ignition signal instructing the first cylinder detected by a trigger sensor 10i from the ignition system of the first cylinder in the ignition circuit of the engine.

Description will hereunder be given of the case where the ignition timing of the engine is measured by the remote control section 30 with the abovedescribed arrangement.

Figure 6:
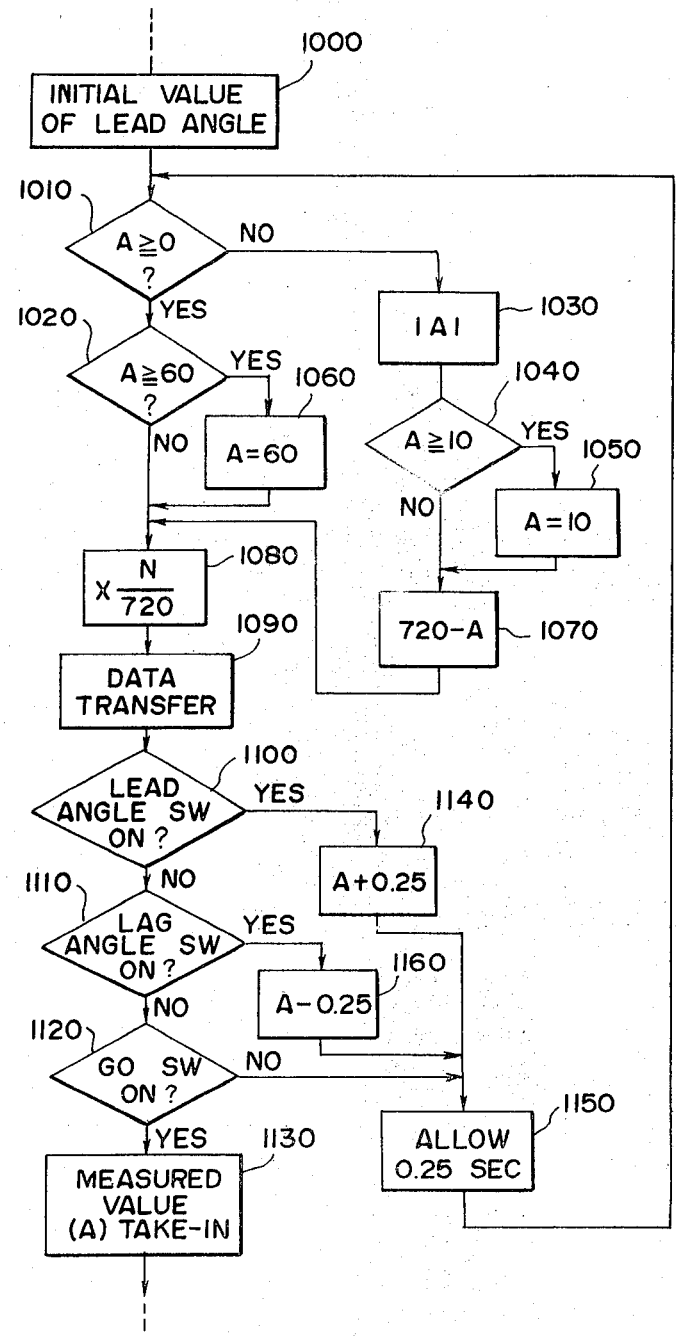
FIG. 6 is a process flow chart showing the portion relating to the ignition timing measurement in the control program of the computer.
Figure 7A:
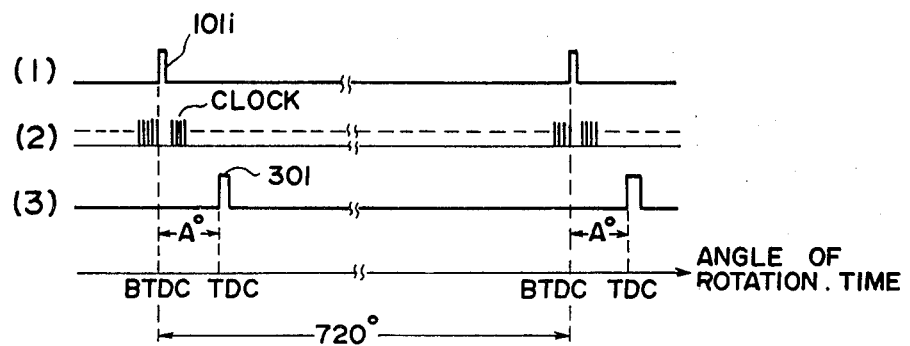
FIGS. 7A and 7B comprise a time chart in explanation of the operation of the trigger pulse for lighting the Xenon tube in the remote control section.
Figure 7B:
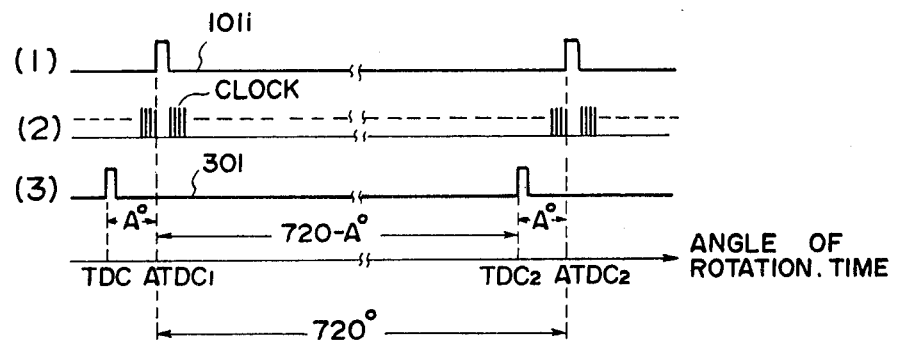

FIG. 6 is a process flow chart showing the portions relating to the measuring of the ignition timing within the control program of the computer 71a, and FIG. 7 is a time chart in explanation of the actions for generating the trigger pulses to cause the Xenon tube 30b to flash.

Firstly, there are required to perform several works including the provision of the trigger sensor 10*i* and the like for detecting the ignition signal, setting of various conditions of the vehicle I to be diagnosed and confirming the abovedescribed works and the like. These work instructions to the operator are successively indicated in the work instructing section 100 (See FIG. 1), and simultaneously with these indications, the flashing diode 32*a* for indicating "go" of the remote control section 30 is caused to flicker. Upon completing the work instructed, the operator presses the "go" switch to close it, whereby the computer 71*a*, in response to the closing of the switch, indicates the succeeding work instruction in the work instructing section 100. Thus, the preparation works necessary for the measuring are successively proceeded. When the operator wants to interrupt the works for his convenience, he presses the "stop" switch 31*d*, whereby the computer 71*a*, in response thereto, temporarily interrupts the process of the diagnosing program, and at the same time causes the flashing diode 32*b* for indicating "stop" to be turned on, thereby indicating the stop of diagnosis.

Upon the completion of all of the preparation works, the computer 71*a* sends out an instruction for measuring the ignition timing to actuate the high voltage power source in the input circuit 61 of the signal process section 60, whereby a high voltage for flashing is fed to the Xenon tube 30*b*. Now, in the vehicle I to be diagnosed, when the first cylinder is ignited, an ignition signal 101*i* is applied from the trigger sensor 10*i* to the main body III, the main body III, in connection with this ignition timing, applies the trigger pulses 301 to the trigger coil 30*c* in the remote control section 30. Thus, the Xenon tube 30*b* of the discharge flasher is brought into a synchronized flashing condition. At this time, the operator manually operates the remote control section 30 in such a manner that the light from the Xenon tube 30*b* focused by the focusing lens 30*a* is directed to the crank pulley of the vehicle I to be diagnosed, whereby the timing mark provided at the top dead center of the crank pulley is visible at a static position when the ignition timing is not in moving condition.

Description will be given with reference to the control program for measuring the ignition timing as shown in FIG. 6. The computer 71*a* sets the typical value of lead angle (or a value of lag angle) $A_0$ of the vehicle I to be diagnosed, which is previously known in a step 1000 as the initial value of lead angle A, this value of lead angle is converted into binary data defining the flash timing, i.e., a delay timing from the ignition timing (in a step 1080), and transferred to the input circuit 61 (in a step 1090). The input circuit 61, upon receiving a shaped pulse 101*i* synchronized with the ignition timing as shown in FIG. 7(*a*)(1), immediately down-counts the transferred binary data by clock pulse (shown in FIG. 7(*a*)(2)), and generates a trigger pulse 301 (shown in FIG. 7(*a*)(3)) upon the completion of the count.

In addition, the binary calculation in a step 1030 is such a calculation that the time T corresponding to a lead angle (lag angle) commensurate to the data N of the rotational speed of the engine is calculated based on the value A of lead angle (lag angle) according to the following equations (provided that the equations are based on a four cycle engine).

(1) In the case of lead angle:

$$T - A \times N \div 720$$

(2) In the case of lag angle:

$$T - (720 - A) \times N \div 720$$

Here, in measuring the value of lag angle, as shown in FIG. 7(*b*), the ignition timing ($ATDC_2$) arrives after the arrival of the top dead center ($TDC_2$), and hence, an angle $(720-A)°$ from the ignition timing in one cycle of rotation is substituted for the value of lag angle.

In the control program, the discrimination as to whether it is a lead angle or lag angle is made in step 1010, and the lead angle is transferred to the step 1080 as is, and the lag angle is processed in step 1070 (720−A), and thereafter, transferred to the step 1080.

As described above, the "visible" position of the timing mark is initially set at a position adjacent the top dead center. At this time, if the ignition timing of the vehicle I to be diagnosed is coincided with the initially set value $A_0$, then the timing mark and the top dead center mark indicated on the engine block seem to be coincided with each other. If the timing mark is not seemed to be coincided with the top dead center mark, then the flash timing should be offset to obtain the coincidence.

If the timing mark is visible ahead of the top dead center mark, then the operator should fress the "lead angle" commanding switch 31*a* of the commander. When the "lead angle" commanding switch 31*a* is closed, the computer discriminates it in step 1100, and changes the value of lead angle (lag angle) into a value "advanced" by 0.25°, for example, in step 1140.

By this, the flash timing of the discharge flasher is delayed by 0.25°, and the timing mark approaches the top dead center mark. In contrast to the above, when the timing mark is behind the top dead center mark, the operator presses the "lag angle" commanding switch 31*b* to be closed, so that the timing mark can be caused to approach the top dead center mark by 0.25° through the processes in the steps 1110 and 1160. The "lead angle" or "lag angle" in the flash timing by the steps 1140 and 1160 can be repeated through step 1150 by pressing the switches 31*a* or 31*b*, the "lead angle" or "lag angle" by 0.25° can be obtained per 0.25 sec.

After the operator completes the work of coinciding the timing mark with the stop dead center mark through the operation of the commander as described above, the operator needs only to press the "go" switch 31*c* of the commander to take in the measured data and complete the measuring the ignition timing. Namely, the step proceeds from 1120 to 1130, while the value A of lead angle (or the value of lag angle) used for calculating the binary data defining the flash timing as described above and the discriminated results as to whether it is a lead angle or lag angle by the step 1010, as the ignition timing of the vehicle I to be diagnosed, as they are, are stored in the predetermined addresses of the memory section of the computer section 71.

Upon the completion of take-in of the measured data, the computer 71*a* sends out an instruction signal of the completion of measuring the ignition timing to bring the flashing high voltage power source in the aforesaid input circuit 61 into a non-operating condition and stop the flashing of the discharge flasher. Then, the computer 71*a* proceeds to the execution of the program for the succeeding inspection and diagnosis.

In the use of this remote control section 30, except for the preparation works, what the operator should actually perform as the works of measuring of the ignition timing is limited to that the operator instructs the "lead angle" or "lag angle" while directing the light from the remote control section 30 to the crank pulley portion, and operates the switch indicating the measuring timing after confirming the coincidence of the timing mark on the crank pulley with the top dead center of the engine block.

In addition, the steps 1020 to 1060 of the flow chart in FIG. 6 set the threshold values of the lead angle and lag angle, presupposes, for example, that the lead angle and lag angle deviated from the limits of the lead angle of 60° and lag angle of 10° are not allowable for the ordinary engines, thus managing to prevent the flash timing from being offset to an appreciable extent due to the mistaken operation of the remote control section 30.

The abovedescribed embodiment is based on a mode of working of the remote control section 30, however, the present invention can be worked by modes to be described hereunder.

For example, instead of using press buttons for instructing the "lead angle" or "lag angle", a potentiometer is used with the magnitudes of output analogue voltages being utilized as the command values for the "lead angle" or "lag angle", which are fed to the computer through an A/D converter circuit.

Additionally, the trigger coil 30c in the discharge flasher is built into the main body III, so that the remote control section 30 can be rendered more compact.

In the abovedescribed embodiment, the method of counting the time intervals of the ignition signals 101i by clock pulses is used so as to feed the rotational speed of the vehicle I to be diagnosed to the computer, however, the signals generated by a rotational speed detector for a tachometer of the vehicle I may be diverted to this purpose.

The transmitting paths 33 connecting the remote control section 30 to the main body III, except for the power lines for the Xenon tube 30b and trigger coil 30c, may be replaced with light signals or the lie. Additionally, the trigger pulses 301 may be transmitted by signals other than the electric pulse signals, such as light signals, however, in this case, it is necessary to provide a converter circuit for converting the flash signals into the electric pulses for the trigger in the remote control section 30.

As described hereinabove, the remote control section 30 in the engine analyzer according to the present invention can offer such outstanding advantages that the burden of the operator in connection with the measuring the ignition timing can be reduced to a considerable extent and the working efficiency can be improved to an appreciable extent.

Description will hereunder be given of a specific embodiment of the fault point indicator 120, which is the fourth characteristic feature of the engine analyzer according to the present invention.

The fault point indicator according to the present invention is of such an arrangement that:

a plurality of items of inspection of a motor car are shown as a graphic display in a planar pattern by use of figures and signs;

in conducting the inspection of the items of inspection, the figures and signs corresponding thereto are separately and optically indicated to constantly clarify the portions of inspection;

an indication different from the indication of the inspected results is made when the period of time required for the inspection exceeds at least a predetermined period of time before each result of inspection is indicated, whereby the distinction between the progress of inspections and the inspected results is made; and even with each item or inspection, for which a short period of time is required, the progress of inspection is indicated for a given period of time or more than that, whereby the status of inspection can be reliably made known to the operator or members other than the operator, particularly, the user of the vehicle to be diagnosed and others.

Figure 8:
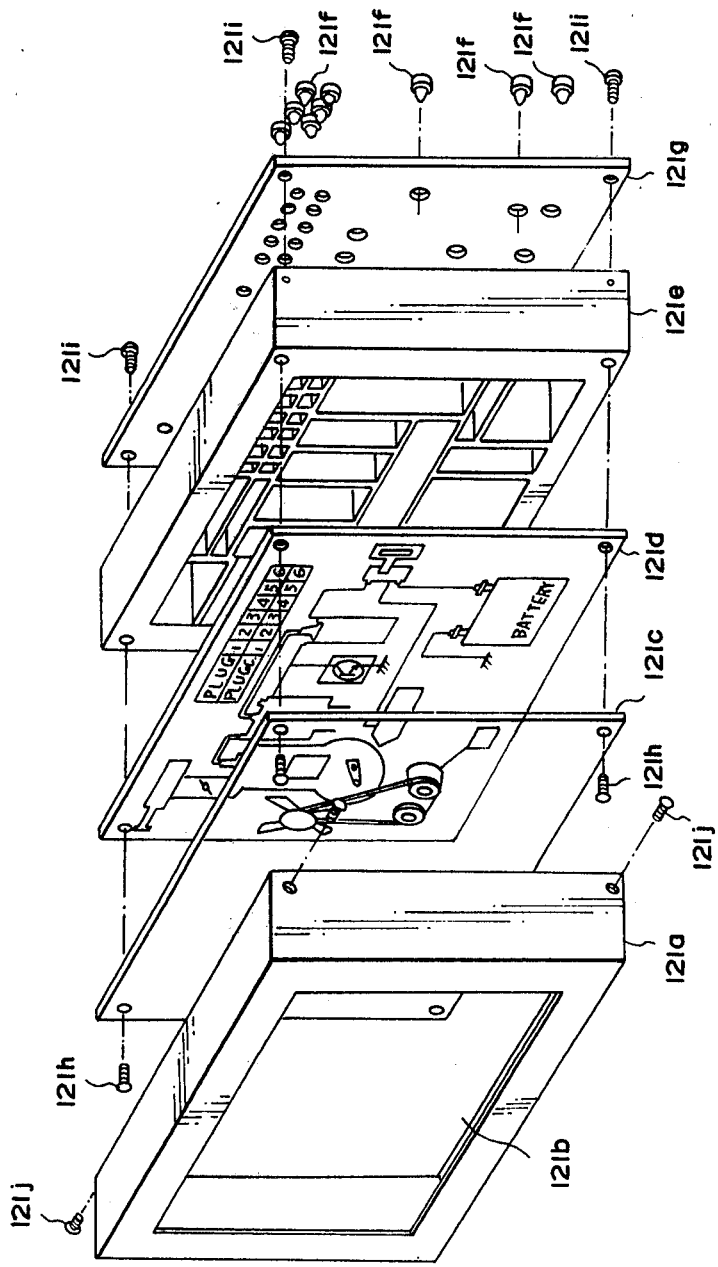
FIG. 8 is a disassembled perspective view showing the fault point indicating section in an example of specific arrangement of the fault point indicator in the abovementioned embodiment.
Figure 9:
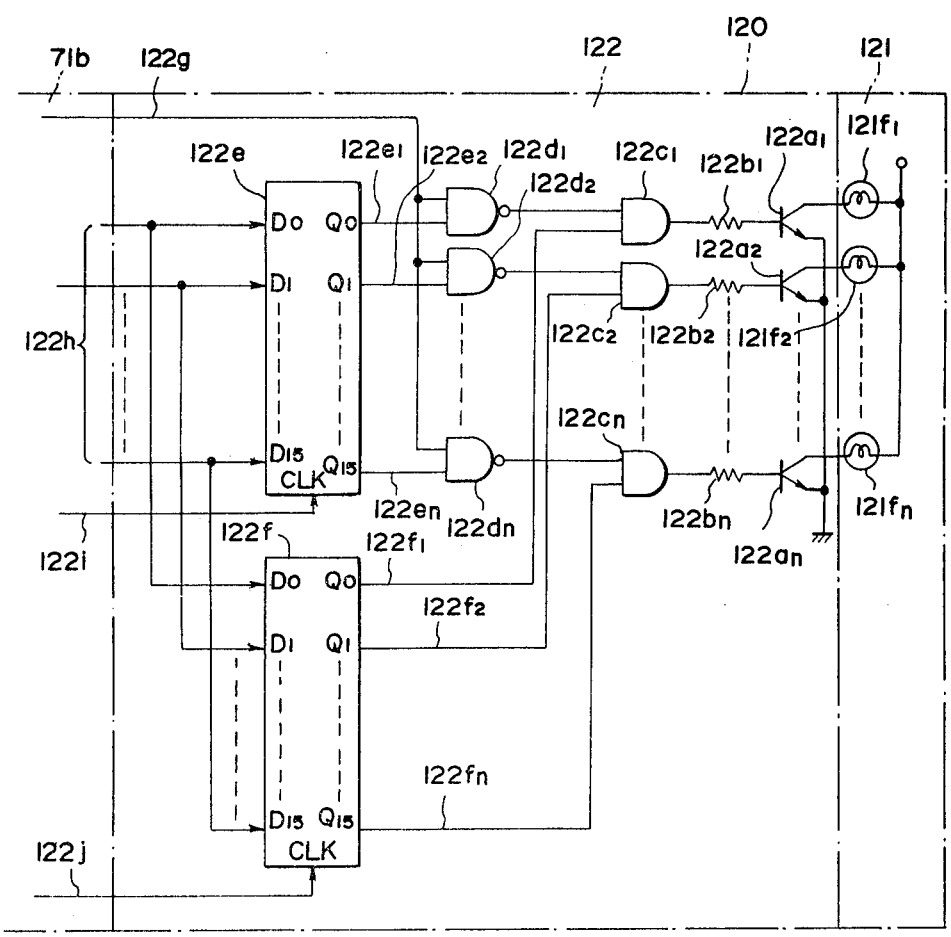
FIG. 9 is an electric circuit diagram showing the drive circuit thereof.
Figure 10:
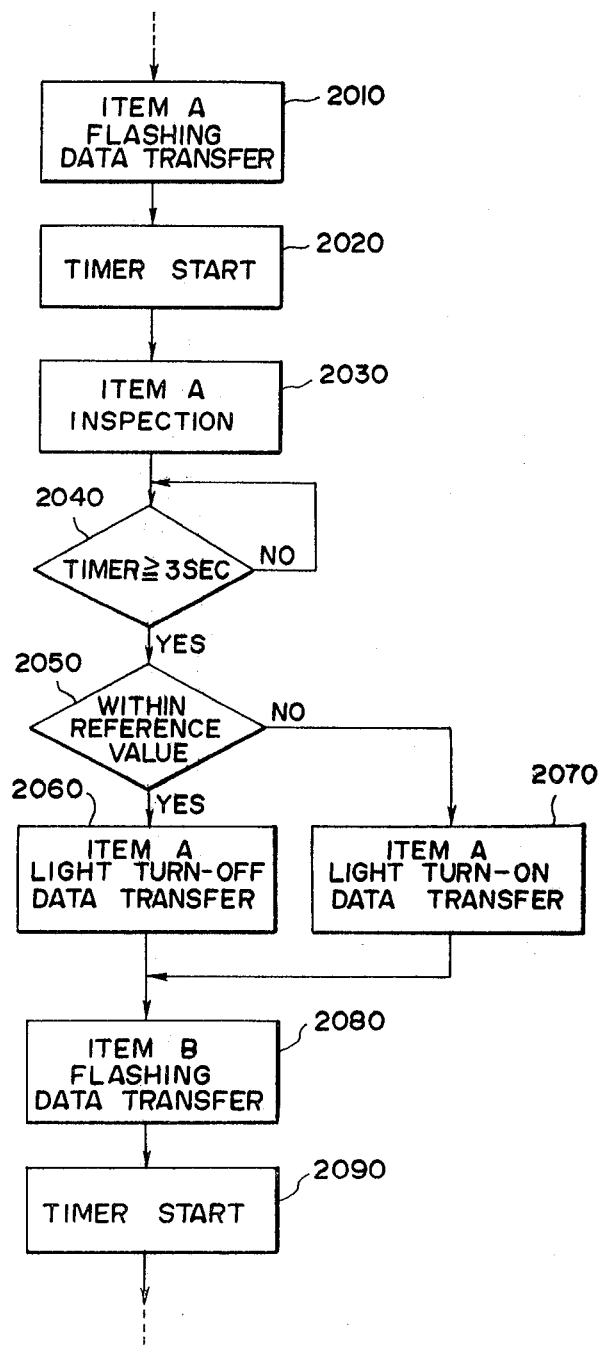
FIG. 10 is a flow chart of the program for controlling the fault point indicator thereof.

Detailed description will hereunder be given of the fault point indicator 120 according to the present invention with reference to the drawings. FIG. 8 shows the indicating section 121 of the fault point indicator 120 according to the present invention; FIG. 9 shows the drive circuit 122 of the indicating section 121; and FIG. 10 is a flow chart of the program for controlling the fault point indicator 120, respectively.

The fault point indicator 120 for successively indicating the statuses of diagnosis for the respective items of inspection consists of the indicating section 121 shown in FIG. 8 and the indicating drive circuit 122 shown in FIG. 9. Referring to FIG. 8, in a recess of a frame body 121a provided in the front thereof with a window 121b, there are successively received a transparent plate 121c, a semitransparent plate 121d for showing the items of inspection of the engine as a graphic display in a planar pattern, in which figures mainly indicating the points of inspection are illustrated with the combinations of letters and signs, a spacer 121e provided therein with partition frames for independently indicating the points of inspection illustrated on the semitransparent plate 121d, and a mount plate 121g having mounted thereon flashers 121f for indicating the respective partitioned spaces divided by the partition frames of the spacer 121e. All of which are integrated into a unit through screws 121h, 121i and 121j. Additionally, in FIG. 8, the screws 121h, 121i, 121j and flashers 121f are mostly omitted and not shown.

In FIG. 9, designated at 121f1, 121f2-121fn are symbols of the aforesaid flashers 121f, and these flashers are separately actuated by transistors 122a1, 122a2-122an, respectively. These transistors 122a1, 122a2-122an are connected to a logical circuit consisting of a data latch circuits 122e, 122f, NAND circuits 122d1, 122d2-122dn and AND circuits 122c1, 122c2-122cn through base resistances 122b1, 122b2-122bn, respectively, and "ON" or "OFF" of the respective transistors 122a1, 122a2-122an are determined by signals 122g, 122h, 122i, and 122 fed through the input-output interface 71b from the computer 71a to this logical circuit as control signals, whereby the flashers 122f (121f1 and so forth) are controlled in the turn-on, turn-off and flickering.

The control signal 122h fed from the computer 71a is a binary signal of 16 bits for example, is synchronized with the clock signal 122i and latched by the data latch circuit 122e. The binary signal latched by the data latch circuit 122e is held as signals 122e1, 122e2-122en until a new binary signal is latched. If there is any "1" level signal out of the signals 122e1, 122e2-122en, then any one of the NAND circuits 122d1, 122d2-122dn, which has been fed with the "1" level signal, inadvertently sends out a flickering signal 122g. Other NAND circuits 122d fed with the "0" level signals continue to send out the "1" level signals.

The other data catch circuit 122f is synchronized with the clock signal 122j to latch the binary signal (122h), and, if there is any "1" level signal out of the binary signals 121*f*1, 122*f*2–122*fn*, then any one of AND circuits 122*c*1, 122*c*2–122*cn* thus latched, which has been fed with the "1" level signal, passes the output of the NAND circuit (122*d*1, 122*d*2–122*dn*) connected to the input thereof. At this time, the AND circuit 122*c* receiving the "1" level signal form the data latch circuit 122*f* continues to send out the "0" level signals.

Description will hereunder be given of the cases, where desired flashers are turned on or flickered, or all the flashers are turned off, by way of the example of the flasher 122*f*2. Firstly, in the case of turn-on, the binary signal (122*h*) feeding the "0" level signal to the NAND circuit 122*d*2 should be latched by the data latch circuit 122*e*, and subsequently, the binary signal (122*h*) feeding the "1" level signal to the AND circuit 122*c*2 should be latched by the data latch circuit 122*f*. By this, the output from the AND circuit 122*c*2 becomes the "1" level, whereby the transistor 122*a*2 is turned on to energize the flasher 121*f*2 to flash. In addition, the data latch circuits 122*e* and 122*f* may be made to latch two or more "0", "1" level signals by the binary signal (122*h*), so that two or more flashers can be turned on at the same time. Secondly, in the case of flickering, the binary signal (122*h*) should be generated to feed "1" level signals to the NAND circuit 122*d*2 and AND circuit 122*c*2, respectively, and the clock signal 122*i* and subsequently the clock signal 122*j* should be fed to be latched by the data latch circuits 122*e* and 122*f*. By this, an inverted signal of the flickering signal 122*g* is fed from the NAND circuit 122*d*2 to the AND circuit 122*c*2. Since other input signals fed to the AND circuit 122*c*2 are of the "1" level, a flickering signal (the inverted signal of the flickering signal 122*g*) is sent out from the AND circuit 122*c*2, whereby the transistor 122*a*2 is turned "ON" and "OFF" so as to flicker the flasher 121*f*2. In addition, the cycle of flickering of the flickering signal 122*g* may be made to be one sec. or thereabout. In the case of flickering the flashers other than the flasher 121*F*2, it may be likewise specified by the binary signal (122*h*).

In the case of turning off all the flashers 121*f*1, 121*f*2–121*fn*, the binary signal (122*h*) having the "0" level signals should be fed to the data latch circuit 122*f*. By this, "0" level signals are fed to all of the AND circuits 122*c*1, 122*c*2–122*cn*, whereby all of the outputs from the AND circuits 122*c*1, 122*c*2–122*cn* become the "0" level signals and all the transistors 122*a*1, 122*a*2–122*an* are turned off, so that all the flashers 121*f*1, 121*f*2–121*fn* can be turned off.

As described hereinabove, the turn-on or flickering of a flasher or flashers is selected through the latch output signal of the data latch circuit 122*e*, and the turn-on, flickering condition or turn-off of a flasher or flashers is selected through the latch output signal from the data latch circuit 122*f*, so that a desirable flasher or flashers can be turned on, flickered or turned off. Since the clock signals 122*i* and 122*g* determining the latch time are emitted in time series, the data of the binary signal (122*h*) is changed between the time of generating the clock signal 122*i* and the time of generating the clock signal 122*j*, so that such a combination can be obtained that a flasher can be flickered under a condition that another flasher is turned on.

Description will hereunder be given of how the indications in the aforesaid fault point indicator 120 can be controlled by the computer 71*a* with reference to the flow chart of FIG. 10 graphically showing the control program of the computer 71*a*.

When the inspection is started on an item A of inspection, firstly, in step 2010, a necessary control signal is fed to the indication drive circuit 132 shown in FIG. 9 so as to flickeringly indicate a figure (or a sign) corresponding to the item A of inspection in the fault point indicator 120, whereby a figure (or a sign) corresponding to the item A of inspection, which is illustrated on the semitransparent plate 121*d* in FIG. 8, is flickeringly indicated. Subsequently, in step 2020, the inspection on the item A of inspection is conducted. In many cases, this inspection includes processes requiring some period of time, such as the calculation of an average value by accumulating several times of detecting signals from the group of detectors 10 in accordance with the item of inspection and the calculation of the extent of changes of the detecting signals, with the result that the periods of time required for obtaining the calculated data are varied. In the succeeding step 2080, even if the period of time for obtaining the calculated data is preset, for example, to be within three sec., at least further three sec. will be spent to determine the period of time for holding the progress of the program.

If three sec. or more have elapsed after the calculated data are obtained, then the process goes forward to step 2050, where it is determined if the calculated data satisfy the preset reference value or not, then, depending upon the determined result, the process goes forward to either step 2060 or 2070. When the calculated data are determined not to satisfy the reference value, then, in the step 2060, the fault point indicator 120 is controlled to turn on the flasher indicating a figure (or sign) corresponding to the item A of inspection. Or, when the calculated data are determined to satisfy the reference value, then, in the step 2070, the fault point indicator 120 is controlled to turn off the flasher indicating a figure (or a sign) corresponding to the item A of inspection.

Immediately thereafter, the inspection goes forward from step 2080 to 2090 . . . on the succeeding item B of inspection in the same manner as the item A of inspection. Whenever the item of inspection is changed one after another, a figure (or sign) corresponding to a new item of inspection flickers to indicate the progress of inspection, however, as for the items, the results of which has been already indicated, it is desirable to indicate the inspected results until all the items are inspected. For this purpose, for example, in the data transfer steps as shown in the steps 2010, 2060, 2070 and 2080, the data transfer steps of turn-on and turn-off, which have been made prior thereto, are checked, the control input signals 122*h*, 122*i* and 122*j* in the data latch circuits 122*e* and 122*f* are so controlled that the items, for which the turn-on and turn-off have been determined, may continue to be turned on and off as determined so.

In addition, in the abovedescribed embodiment, in order to discriminate the normalities from abnormalities in the progress and results of inspection, the turn-on, turn-off and flickering are alloted to the indicators, respectively, which proves advantageous in saving the indicators in number of use. However, three different types of indicators varied in flashing colors may be alloted to the items of inspection, respectively, and the turn-on and turn-off may be selected according to the different types of indicators as described above. Furthermore, in addition to the planar arrangement of the indicators like lamps, panels illustrating the points of inspection may be flashingly indicated, or indicating means for indicating with polarized lights is usable. Additionally, the points of inspection may be indicated by use of a cathode-ray tube.

In the fault point indicator 120 according to the present invention as described above, a plurality of items of inspection of the vehicle are arranged in a plane by use of figures and signs, the figure and sign corresponding to each item of inspection is optically indicated, the indication of each item of inspection differing from the indication of the results of inspection is optically performed for at least a preset period of time or more than that. Hence, the point of inspection, progress of inspection and the results of inspection can be discriminated on one and the same plane and the periods of time for indicating the progress of inspection is set for each item of inspection, thus presenting such outstanding advantages that the discrimination as described above can be readily made and the transfer of the items of inspection one from another can be reliably grasped.

The engine analyzer according to the present invention can perform the diagnosis about the items which will be described hereunder.

Figure 11:
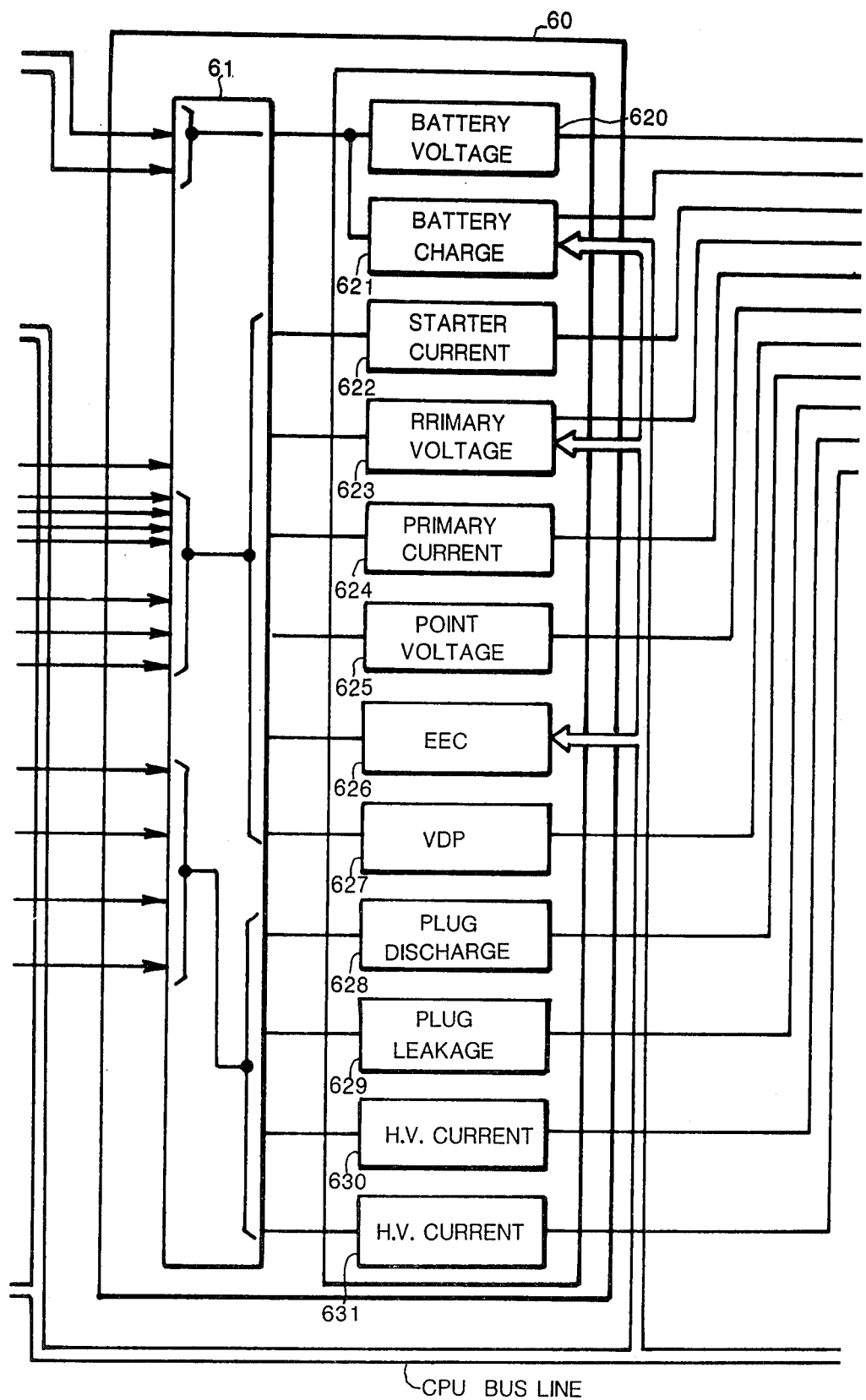
FIG. 11 is a block diagram showing the arrangement of the embodiment of the engine analyzer according to the present invention.
Figure 11:
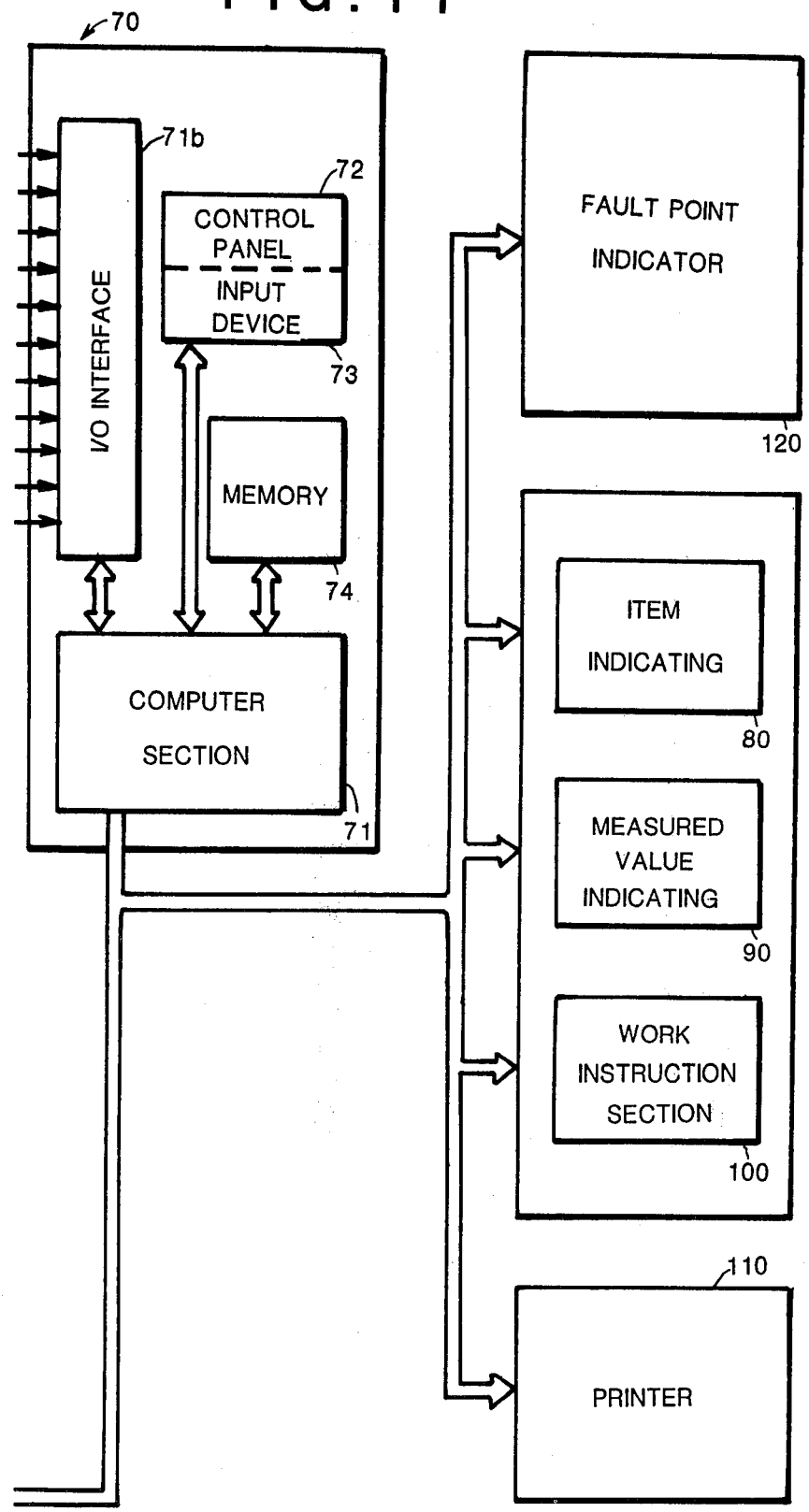

Description will be given of such items under separate paragraphs with reference to FIG. 11.

A. Battery Capacity

Battery sensors 10a, 10b are fastened to the vehicle-mounted battery, the voltage drop in the vehicle-mounted battery is detected by a battery voltage signal process circuit 620 when a high current is applied to a load 21l incorporated in the system through the high current relays 21a, 21b, and the magnitude of the voltage drop is discriminated by the computer 71a to thereby determine the capacity of the vehicle-mounted battery.

B. Resistance of the Battery Terminal

Battery sensors 10a, 10b are fastened to the vehicle-mounted battery, the potential difference between the center electrode and the terminal of the vehicle-mounted battery is detected by a battery voltage signal process circuit 620 when a high current is applied to a load 21l incorporated in the system through the high current relays 21a, 21b, and further, the current flowing through the load 21l is detected, both values thus obtained are calculated in division by the computer 71a to thereby obtain the resistance value of the battery terminal.

C. Starter Current at the Start

The starter current flowing from the vehicle-mounted battery to the starting motor is detected by a battery current sensor BCS when the engine of the vehicle is automatically cranked by the engine drive control means 21, processed by a starter current signal process circuit 622, and the magnitude of the current signal is determined by the computer 71a so as to detect an abnormality in the starting motor.

D. Ballance between the Compression Ratios

The starter current flowing from the vehicle-mounted battery to the starting motor is detected by the battery current sensor BCS when the engine of the vehicle is automatically cranked by the engine drive control means 21, the peak value thereof is processed by the starter current signal process circuit 622, the fluctuations in the starter currents are separately processed from one cylinder to another by the computer 71a, and relative ratios thereof between the respective cylinders are calculated so as to convert the obtained results into relative ratios of compression ratios and measure same.

E. Dielectric Strength of the High Voltage Circuit

The diagnosing probes 10e, 10f, 10g and 10h are connected to portions between the plugs and plug cords of the respective cylinders respectively, and, the diagnosing attachment 10d is connected to a poriton between the output end of ignition coil and coil cord, a voltage leak generated due to abnormality in the high voltage circuit section of the engine consisting of a coil cord, a distributor and a plug cord is detected by a high voltage applying signal process circuit 630 when a high voltage signal generated in synchronism with the top dead center or the ignition timing of the engine is applied from the inspection power source 54 of the multi-cylinder engine inspecting means to said high voltage circuit section through the diagnosing attachment 10d under a condition that the engine is automatically cranked by the engine drive control means 21, and, the minimum value among the voltage leak signals thus detected is discriminated by the computer 71a to thereby diagnose the insulation dielectric strength of said high voltage circuit section.

F. Resistance of the High Voltage Circuit

The diagnosing probes are connected to portions between the plugs and plug cords of the respective cylinders, respectively, and, the diagnosing attachment 10d is connected to a portion between the output end of ignition coil and coil cord, a high voltage signal is generated from the inspection power source 54 in synchronism with the top dead center or the ignition timing of the engine when the engine is automatically cranked by the engine drive control means 21 under a condition that the output ends of said diagnosing probes are short-circuited through the switching circuit 40 in the inspection power source 54, and said high voltage signal is applied through the diagnosing attachment 10d to the high voltage circuit section consisting of a coil cord, a distributor and a plug cord. This high voltage signal discharges when a rotor in the distributor is opposed to an external electrode, and there is formed a closed circuit of the inspection power source 54—switching circuit 40—diagnosing attachment 10d—coil cord—distributor—plug cord—diagnosing probe. Consequently, the current flowing through this closed circuit is detected and processed by a high voltage current signal process circuit 631, and at the same time, the voltage value applied is detected and processed by the high voltage circuit applying signal process circuit 630, both values are calculated in division by the computer 71a to thereby measure the resistance value of the high voltage circuit of the vehicle.

G. Discharge Voltage of the Plugs

The discharge dielectric breakdown voltages generated between the electrodes of plugs of the respective cylinders are detected and processed by a plug discharge voltage process circuit 628 when the diagnosing probes are fastened to the plugs of the respective cylinders and high voltages are applied to the respective cylinders from the inspection power source 51 by switching with the switching circuit 40, and the magnitude of the discharge dielectric breakdown voltages are determined by the computer 71a to thereby diagnose abnormalities or the presence of sooty condition of the plugs.

H. Insulation Resistance of the Plugs

The plug leakage currents flowing from the plugs to the engine body are detected by the inspection power source 52 when the diagnosing probes are fastened to the plugs of the respective cylinders and high voltages are applied from the inspection power source 52 to the respective cylinders by switching with the switching circuit 40, processed by a plug leakage current process circuit 629, and the values thus obtained and an output voltage from said inspection power source 52 are calculated utilizing division by the computer 71a to thereby measure as the insulation resistance of the plugs.

I. Resistance of the Contact Point

The current flowing through the contact point of the ignition system of the engine is detected by a coil current sensor when the contact point is set into a closed condition by the engine drive control means under a condition that the engine is stopped, processed by a primary current signal process circuit 624, and at the same time, a voltage applied to the contact point is detected by a point clip PC, processed by a point voltage signal process circuit 625, and both signals are calculated in division by the computer 71a to thereby measure the contact resistance of the contact point.

J. Primary Circuit Resistance

During idling of the engine, a primary current flowing through the primary circuit of the ignition system is detected by a coil current sensor CCS, processed by a primary current signal process circuit 624, and at the same time, the voltage value of the vehicle-mounted battery is detected by the battery sensors 10a, 10b, processed by a battery voltage signal process circuit 620, both values are calculated in division by the computer 71a to thereby measure the resistance of the primary circuit.

K. V Belt Slip

During idling of the engine, a primary voltage detected by a coil⊖clip CC processed by a primary voltage signal process circuit 623, the cycle thereof is measured by the computer 71a as the number of rotation of the engine. Subsequently, a ripple component of an output from an alternator contained in a battery charge signal detected from the battery sensors 10a, 10b is processed and detected by the battery charge signal process circuit 621, and the frequencies thereof are measured by the computer. Then, the number of rotations of the engine and the number of rotations of the alternator thus obtained are compared during idling of the engine and the results are stored in the memory section 72. Next, when the engine is rapidly accelerated, both signals, which change and rise in value every moment, are measured by the computer, the ratio of rise between both signal (signals of numbers of rotation) is calculated, the difference therebetween is sought to thereby measure the slip rate of the V belt connecting the alternator to the engine.

From the foregoing description, it should be apparent to one skilled in the art that the abovedescribed embodiment is but one of many possible specific embodiments which can represent the applications of the principles of the present invention. Numerous and varied other arrangements can be readily divised by those skilled in the art without departing from the spirit and scope of the invention.

What is claimed is:

1. An engine analyzer comprising:
   detecting means including a plurality of sensors which when engine analysis is to occur are connected to given portions around an engine such as an internal combustion engine for detecting the characteristics of the respective given portions as electric signals;
   engine drive control means including an auxiliary electric power source, which when engine analysis is to occur is connected from outside to an engine starter motor as the power source for said engine starter motor which is independent from the battery connected to the engine, and a control circuit capable of controlling a drive circuit of said engine starter motor from outside;
   signal processing means for converting electric signals fed from said detecting means and said engine drive control means to indicate the characteristics of the respective portions of the engine into signal aspects to be easily processed;
   centralized control means including a computer for successively operating and processing the outputs fed from said signal processing means according to a preset program, comparing and determining said operation results with values preset in accordance with the respective signals and feeding command signals for the inspection and diagnosis of the engine; and
   diagnosis indicating means being operable by the command signals fed from said centralized control means, including means for displaying each portion being inspected on a graphic display of a planar pattern, means for successively instructing the predetermined work procedures to an operator and means for giving the results of diagnosis of predetermined items of inspection.

2. The engine analyzer as set forth in claim 1, further comprising:
   a plurality of diagnosing probe means for feeding inspection signals from outside an engine and engine accessory to a high voltage circuit section in an engine ignition circuit; and
   multi-cylinder engine inspecting means including a plurality of electric power sources for generating inspection signals in accordance with the purposes of inspection and a switching circuit for separately supplying the inspection signals selected in accordance with the respective cylinders to said plurality of diagnosing probe means.

3. The engine analyzer as set forth in claim 2, further comprising:
   remote control means having a switch for carrying out, discontinuing or interrupting a set mode of said engine analyzer.

4. The engine analyzer as set forth in claim 3, further comprising:
   fault point indicating means for indicating the condition of inspection on the points of inspection and the results of inspection.

5. The engine analyzer as set forth in claim 4, wherein:
   said diagnosis indicating means further comprises:
   an item indicating section for indicating each item under inspection; and a determined value indicating section for indicating determined values for the items of inspection.

6. The engine analyzer as set forth in claim 5, further comprising record means for recording the measured and determined values and the results analyzed based on the above measured values.

7. The engine analyzer as set forth in claim 6, wherein:
said fault point indicating means has a graphic display of planar pattern for showing the fault point in figures with letters and signs.

8. The engine analyzer as set forth in claim 7, wherein said remote control means further comprises timing light means which includes:
a timing light for flashing in synchronism with an ignition signal detected by the engine ignition circuit; and
a switch for regulating the flash timing of said timing light through outputs fed from said centralized control means.

9. The engine analyzer as set forth in claim 8, wherein said detecting means has a battery sensor.

10. The engine analyzer as set forth in claim 9, wherein said engine drive control means comprises:
two switches contacting polarities of a vehicle-mounted battery through battery sensors, respectively;
two other switches including one inserted between one of said former two switches and an engine control terminal and the other inserted between one of said former two switches and a charger;
a switch drive circuit connected to said former two switches and latter two switches for driving said switches;
an auxiliary power source having a potential equivalent to said vehicle-mounted battery;
a charge discriminator circuit connected to said auxiliary power source for discriminating the charge condition;
a charger connected to one of said former two switches and one of said latter two switches;
a power relay for connecting said auxiliary power source to said vehicle-mounted battery; and
a polarity discriminator circuit connected to said battery sensors for discriminating the conditions of said battery sensors.

11. The engine analyzer as set forth in claim 10 wherein said multi-cylinder engine inspecting means comprises:
a switching circuit section including: a plurality of high voltage switches connected to a group of detectors and applied thereto with high voltage; and a switch drive circuit for actuating and controlling said high voltage switches in a manner to combine the ignition order with the inspection purposes.
a first inspecting section including: a DC high voltage power source for generating a DC high voltage; a capacitor connected to said DC high voltage power source; and a divider circuit connected to said DC high voltage power source, for dividing an output voltage from said power source;
a second inspecting section including: a DC constant voltage power source for delivering a stabilized DC voltage; and a plurality of resistors for dividing said output voltage from said DC constant voltage power source;
a third inspecting section including: a resistor circuit selectively connected to said plurality of high voltage switches, for dividing output voltages from said high voltage switches;
a boosting transformer connected to a transistor controllable by a signal process circuit section;
a fourth inspecting section including: a power relay included in an output circuit of said transistor, for on-off operating said transistor; a diode connected to a secondary winding of said boosting transformer, for half-wave rectifying a high output voltage from the secondary wiring; and two resistors connected to the secondary winding of said boosting transformer, for dividing an output voltage from said boosting transformer; and
a relay drive circuit connected to said power relay for driving and controlling said power relay.

12. The engine analyzer as set forth in claim 11, wherein said detecting means comprises: a battery current sensor for detecting a current flowing from said vehicle-mounted battery to a starter motor; a coil current sensor connected to an ignition coil, for detecting a current flowing to said ignition coil; detachable clips connected to said ignition coil, a point of an interruptor and the engine body, respectively; and voltage detecting probes connected to said vehicle-mounted battery and said point, respectively, for detecting voltages from said vehicle-mounted battery and said point.

13. The engine analyzer as set forth in claim 12, wherein said probe means comprises: a diagnosing probe inserted between said ignition plug and a plug cord; and a diagnosing attachment inserted between an output terminal of said ignition coil on the secondary winding and a coil cord.

14. The engine analyzer as set forth in claim 13, wherein said signal processing means comprises:
an input circuit connected to the group of sensors of said detecting means, the engine drive control means and the multi-cylinder engine inspecting means;
a battery voltage signal process circuit connected to said input circuit;
a battery discharge signal process circuit connected to said input circuit;
a starter current signal process circuit connected to said input circuit;
a primary voltage signal circuit connected to said input circuit;
a primary current signal process circuit connected to said input circuit;
a point voltage signal process circuit connected to said input circuit;
a trigger signal process circuit connected to said input circuit;
an ignition signal process circuit connected to said input circuit;
a plug discharge voltage process circuit connected to said input circuit;
a plug leaking current process circuit connected to said input circuit;
a high voltage circuit applying signal process circuit connected to said input circuit; and
a high voltage circuit current signal process circuit connected to said input circuit.

15. The engine analyzer as set forth in claim 14, wherein said centralized control means comprises:
an interface connected to the process circuit of said processing means;

a control panel for feeding the specific predetermined items of the diagnosis;

an input device connected to said control panel;

a computer connected to said input device and said interface for operating and processing the outputs from the process circuits of said signal processing means so as to make the determination; and a memory section connected to said computer for storing the specific predetermined items of vehicle to be diagnosed, such as running distances, ignition systems, the reference values for each vehicle.

16. The engine analyzer as set forth in claim 15, wherein said fault point indicating means comprising:

an indicating section consisting of: said planar pattern; a box portion having partition frames corresponding to the items of inspection of said pattern; and flashers arranged for the respective partition frames; and an indication drive circuit connected to the flashers of said indicating section for indicating the portions of diagnosis and fault points in response to signals from computer.

17. The engine analyzer as set forth in claim 16, wherein said record means comprises:

a printer for printing the determined results, measured values, and reference values on printing paper.

18. The engine analyzer as set forth in claims 2 or 15, further comprising: plug discharge voltage detecting means for applying high voltages to the plugs of the respective cylinders of the engine, detecting the discharge dielectric breakdown voltage generated between the electrodes of the plugs and processing the detected discharge dielectric breakdown voltages so as to detect unusual sooty conditions of the spark gaps of the plugs.

19. The engine analyzer as set forth in claims 2 or 15, further comprising: plug insulation resistance detecting means for detecting plug leaking currents flowing between the plugs and the engine body when high voltages are applied to the plugs of the respective cylinders of the engine, and processing the detected plug leakage current so as to detect the insulation resistances of the plugs.

20. The engine analyzer as set forth in claims 2 or 15, further comprising: high voltage circuit dielectric strength detecting means for detecting voltage leakage in high voltage circuits and detecting the discharge dielectric strength and abnormalities of the high circuit section of the engine comprising a coil cord, a distributor and a plug cord based on the minimum values of the voltage leakage thus obtained, when the engine is cranked and high voltage is applied to said high voltage circuit section of the engine in synchronism with the top dead center or the ignition timing of the engine.

21. The engine analyzer as set forth in claims 2 or 15, further comprising: high voltage circuit resistance detecting means for detecting the current flowing through the high voltage circuit when the engine is cranked in a condition where portions between the plugs and the plug cords of the respective cylinders of the engine are grounded with cords of low resistance and high voltages are applied to the high voltage circuit section of the engine consisting of a coil cord, a distributor and a plug cord in synchronism with the top dead center or the ignition timing of the engine and processing the detected high voltage circuit current so as the detect the resistance value of said high voltage circuit section.

22. The engine analyzer as set forth in claims 2 or 15, further comprising: battery capacity detecting means for detecting the voltage drop rate of the battery when a high current is applied from the battery of the engine to a load of low resistance and processing the detected voltage drop rate so as to detect the battery capacity.

23. The engine analyzer as set forth in claims 2 or 15, further comprising: battery terminal resistance detecting means for detecting the potential difference between the center electrode and the terminal of the battery and the current flowing through a load of low resistance when a high current is applied from the battery of the engine to the load of low resistance and processing the detected potential difference so as to detect the resistance value of the battery terminal.

24. The engine analyzer as set forth in claims 2 or 15, further comprising: engine compression ratio balance detecting means for detecting the current flowing from the battery to the starting motor when the engine is cranked so as to apply the peak value of the current to the respective cylinders, and detecting the relative ratios between compression ratios of the respective cylinders of the engine by calculating the relative ratios.

25. The engine analyzer as set forth in claims 2 or 15, further comprising: belt slip rate detecting means for detecting the slip rate of the belt by comparing the frequencies of the primary voltage signal of the coil with the frequencies of the ripple component of the output from the alternator, and subsequently, detecting the difference between the comparative values of both when the engine is repidly accelerated.

26. The engine analyzer as set forth in claims 2 or 15, further comprising: starter current detecting means for detecting the starter current flowing from the battery to the starting motor when the engine is cranked, and further, detecting an abnormality in the starting motor based on the value of the current.

27. The engine analyzer as set forth in claims 2 or 15 further comprising: points resistance detecting means for detecting the contact resistance of the points in a manner that the points of the ignition systems are closed when the engine is stopped, and then, the current and voltage applied to the points are detected when the engine is turned on, and a ratio between the detected current and voltage is calculated.

28. The engine analyzer as set forth in claim 2 or 15, further comprising: primary current resistance detecting means for detecting the resistance value of the primary circuit in a manner that the primary current flowing to the primary circuit of the ignition system is detected during idling of the engine, and simultaneously, the voltage of the battery is detected and the ratio between the detected primary current and voltage is calculated.

29. The engine analyzer as set forth in claim 10, wherein timing light means of said remote control means includes: a Xenon tube, a focusing convex lens provided close to a light emitting portion of said Xenon tube; and a trigger coil driven and controlled by said signal process circuit section, for triggering the Xenon tube.

* * * * *

UNITED STATES PATENT AND TRADEMARK OFFICE
CERTIFICATE OF CORRECTION

PATENT NO. : 4,375,672
DATED : March 1, 1983
INVENTOR(S) : Takayuki Kato et al.

It is certified that error appears in the above-identified patent and that said Letters Patent is hereby corrected as shown below:

On the title page, Item /73/ should read

-- Kabushiki Kaisha Toyota Chuo Kenkyusho,

Toyota Jidosha Hanbai Kabushiki Kaisha and

Nippondenso Company Limited, Nagoya, Aichi, Japan --.

Signed and Sealed this

Twenty-fifth Day of October 1983

[SEAL]

*Attest:*

*Attesting Officer*

GERALD J. MOSSINGHOFF

*Commissioner of Patents and Trademarks*